(12) United States Patent
Nagahama et al.

(10) Patent No.: US 10,627,640 B2
(45) Date of Patent: Apr. 21, 2020

(54) OPTICAL ELEMENT ANGLE ADJUSTMENT DEVICE AND EXTREME ULTRAVIOLET LIGHT GENERATION DEVICE

(71) Applicant: GIGAPHOTON INC., Tochigi (JP)

(72) Inventors: Kenshiro Nagahama, Oyama (JP); Yukio Watanabe, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/209,631

(22) Filed: Dec. 4, 2018

(65) Prior Publication Data

US 2019/0113765 A1 Apr. 18, 2019

Related U.S. Application Data

(63) Continuation of application No. PCT/JP2016/070884, filed on Jul. 14, 2016.

(51) Int. Cl.

| G02B 7/00 | (2006.01) |
|---|---|
| G02B 27/00 | (2006.01) |
| G02B 27/14 | (2006.01) |
| G03F 7/20 | (2006.01) |
| G02B 7/182 | (2006.01) |
| H05G 2/00 | (2006.01) |

(52) U.S. Cl.
CPC ......... *G02B 27/141* (2013.01); *G02B 7/1822* (2013.01); *G03F 7/70033* (2013.01); *H05G 2/008* (2013.01)

(58) Field of Classification Search
CPC ................ G02B 27/141; G02B 7/1822; G02B 7/70033; H05G 2/008
USPC ..... 250/441.11, 442.11, 443.1, 493.1, 504 R
See application file for complete search history.

(56) References Cited

U.S. PATENT DOCUMENTS 5,862,428 A * 1/1999 An .................. G03B 17/12
359/889
8,925,409 B2 1/2015 Hodge et al.
(Continued)

FOREIGN PATENT DOCUMENTS

| JP | 49-025953 U1 | 3/1974 |
|---|---|---|
| JP | 05-004113 U | 1/1993 |

(Continued)

OTHER PUBLICATIONS

International Search Report issued in PCT/JP2016/070884; dated Oct. 18, 2016.

(Continued)

*Primary Examiner* — Nicole M Ippolito
(74) *Attorney, Agent, or Firm* — Studebaker & Brackett PC

(57) ABSTRACT

An optical element angle adjustment device includes a first hinge that is an elastic hinge configured to connect a first plate and a second plate with each other, an optical element holding part attached to at least one of the first plate and the second plate, and a first adjusting screw configured to apply force in a direction of closing the first hinge to adjust a tilt angle of at least one of the first plate and the second plate. An end in an axis direction of the first adjusting screw is provided with a first press member configured to slidably abut on one of the first plate and the second plate. At least one of a first press member side abutting portion and a first hinge side abutting portion on which the first press member abuts has a curved surface in a curved surface shape.

20 Claims, 32 Drawing Sheets

(56) References Cited

U.S. PATENT DOCUMENTS

| | | | |
|---|---|---|---|
| 2003/0035229 A1* | 2/2003 | Willis | G02B 7/004 |
| | | | 359/819 |
| 2006/0198083 A1* | 9/2006 | Kobayashi | H01G 2/06 |
| | | | 361/540 |
| 2013/0320232 A1 | 12/2013 | Hori et al. | |
| 2015/0055353 A1* | 2/2015 | Hutchens | F16M 13/02 |
| | | | 362/370 |
| 2017/0189998 A1* | 7/2017 | Luo | B23K 37/0426 |

FOREIGN PATENT DOCUMENTS

| | | |
|---|---|---|
| JP | 2001-059928 A | 3/2001 |
| JP | 2005-273808 A | 10/2005 |
| JP | 2007-247855 A | 9/2007 |
| JP | 2010-172838 A | 8/2010 |
| JP | 2013-251100 A | 12/2013 |

OTHER PUBLICATIONS

The International Preliminary Report on Patentability and Translation of Written Opinion of the International Searching Authority; PCT/JP2016/070884; dated Jan. 15, 2019.

* cited by examiner

RELATED ART

RELATED ART

OPTICAL ELEMENT ANGLE ADJUSTMENT DEVICE AND EXTREME ULTRAVIOLET LIGHT GENERATION DEVICE

CROSS-REFERENCE TO RELATED APPLICATIONS

The present application is a continuation application of International Application No. PCT/JP2016/070884 filed on Jul. 14, 2016. The content of the application is incorporated herein by reference in its entirety.

BACKGROUND

1. Technical Field

The present disclosure relates to an optical element angle adjustment device and an extreme ultraviolet light generation device.

2. Related Art

In recent years, along with microfabrication in the semiconductor manufacturing process, fine transfer patterns in photolithography of the semiconductor manufacturing process have been developed rapidly. In the next generation, microfabrication of 20 nm or smaller will be required. Accordingly, it is expected to develop an exposure device in which a device for generating extreme ultraviolet (EUV) light having a wavelength of about 13 nm and a reflection reduction projection optical system are combined.

As EUV light generation devices, three types of devices are proposed, namely, a laser produced plasma (LPP) type device that uses plasma generated when a target substance is irradiated with laser light, a discharge produced plasma (DPP) type device that uses plasma generated by discharging, and a synchrotron radiation (SR) type device that uses orbital radiation light.

CITATION LIST

Patent Literature

Patent Literature 1: U.S. Pat. No. 8,925,409
Patent Literature 2: Japanese Patent Application Laid-Open No. 2001-059928
Patent Literature 3: Japanese Utility Model Application Laid-Open No. 05-004113

SUMMARY

An optical element angle adjustment device according to one aspect of the present disclosure may include a first plate, a second plate, a first hinge, an optical element holding part, and a first adjusting screw. The second plate may face the first plate. The first hinge may be an elastic hinge configured to connect the first plate and the second plate with each other. The optical element holding part may be configured to hold an optical element, and attached to at least one of the first plate and the second plate. The first adjusting screw may be configured to apply force to the first plate and the second plate in a direction of closing the first hinge to adjust a tilt angle of at least one of the first plate and the second plate using the first hinge as a turning axis. The first adjusting screw may have a first press member at an end in an axis direction of the first adjusting screw. The first press member may be configured to slidably abut on one of the first plate and the second plate. At least one of a first press member side abutting portion and a first hinge side abutting portion may have a curved surface in a curved surface shape. The first press member side abutting portion may be a portion of the first press member and is configured to abut on one of the first plate and the second plate. The first hinge side abutting portion may be a portion of one of the first plate and the second plate on which the first press member abuts.

An ultraviolet light generation device according to another aspect of the present disclosure may include a chamber, a droplet generator, an optical element, and an optical element angle adjustment device. In the chamber, plasma may be generated. The droplet generator may be configured to feed, into the chamber, a droplet of a target substance that is a generation source of the plasma. The optical element may be disposed on an optical path of laser light radiated to the droplet. To the optical element angle adjustment device, the optical element may be mounted. A target of the droplet fed from the droplet generator into the chamber may be irradiated with the laser light and made into plasma, and ultraviolet light may be generated. The optical element angle adjustment device may include a first plate, a second plate, a first hinge, an optical element holding part, and a first adjusting screw. The second plate may face the first plate. The first hinge may be an elastic hinge configured to connect the first plate and the second plate with each other. The optical element holding part may be configured to hold an optical element, and attached to at least one of the first plate and the second plate. The first adjusting screw may be configured to apply force to the first plate and the second plate in a direction of closing the first hinge to adjust a tilt angle of at least one of the first plate and the second plate using the first hinge as a turning axis. The first adjusting screw may have a first press member at an end in an axis direction of the first adjusting screw. The first press member may be configured to slidably abut on one of the first plate and the second plate. At least one of a first press member side abutting portion and a first hinge side abutting portion may have a curved surface in a curved surface shape. The first press member side abutting portion may be a portion of the first press member and is configured to abut on one of the first plate and the second plate. The first hinge side abutting portion may be a portion of one of the first plate and the second plate on which the first press member abuts.

BRIEF DESCRIPTION OF THE DRAWINGS

Some embodiments of the present disclosure will be described below as just examples with reference to the accompanying drawings.

EMBODIMENTS

Contents
1. Overall description of extreme ultraviolet light generation system
   1.1 Configuration
   1.2 Operation
2. Terms
3. Problem
4. First Embodiment
   4.1 Configuration
   4.2 Operation
   4.3 Effect
5. Second Embodiment
   5.1 Configuration
   5.2 Operation
   5.3 Effect
6. Third Embodiment
   6.1 Configuration
   6.2 Operation
   6.3 Effect
7. Fourth Embodiment
   7.1 Configuration
   7.2 Operation
   7.3 Effect
8. Fifth Embodiment
   8.1 Configuration
   8.2 Operation
   8.3 Effect
9. Sixth Embodiment
   9.1 Configuration
   9.2 Operation
   9.3 Effect
10. Seventh Embodiment
    10.1 Configuration
    10.2 Operation
    10.3 Effect
11. Eighth Embodiment
    11.1 Configuration
    11.2 Operation
    11.3 Effect
12. Ninth Embodiment
    12.1 Configuration
    12.2 Operation
    12.3 Effect
13. Tenth Embodiment
    13.1 Configuration
    13.2 Operation
    13.3 Effect
14. Eleventh Embodiment
    14.1 Configuration
    14.2 Operation
    14.3 Effect
15. Modifications of Embodiments Hereinafter, embodiments of the present disclosure will be described in detail with reference to the drawings.

The embodiments described below illustrate some examples of the present disclosure, and do not limit the contents of the present disclosure. All of the configurations and the operations described in the embodiments are not always indispensable as configurations and operations of the present disclosure. The same constituent elements are denoted by the same reference signs, and overlapping description is omitted.

Figure 1:
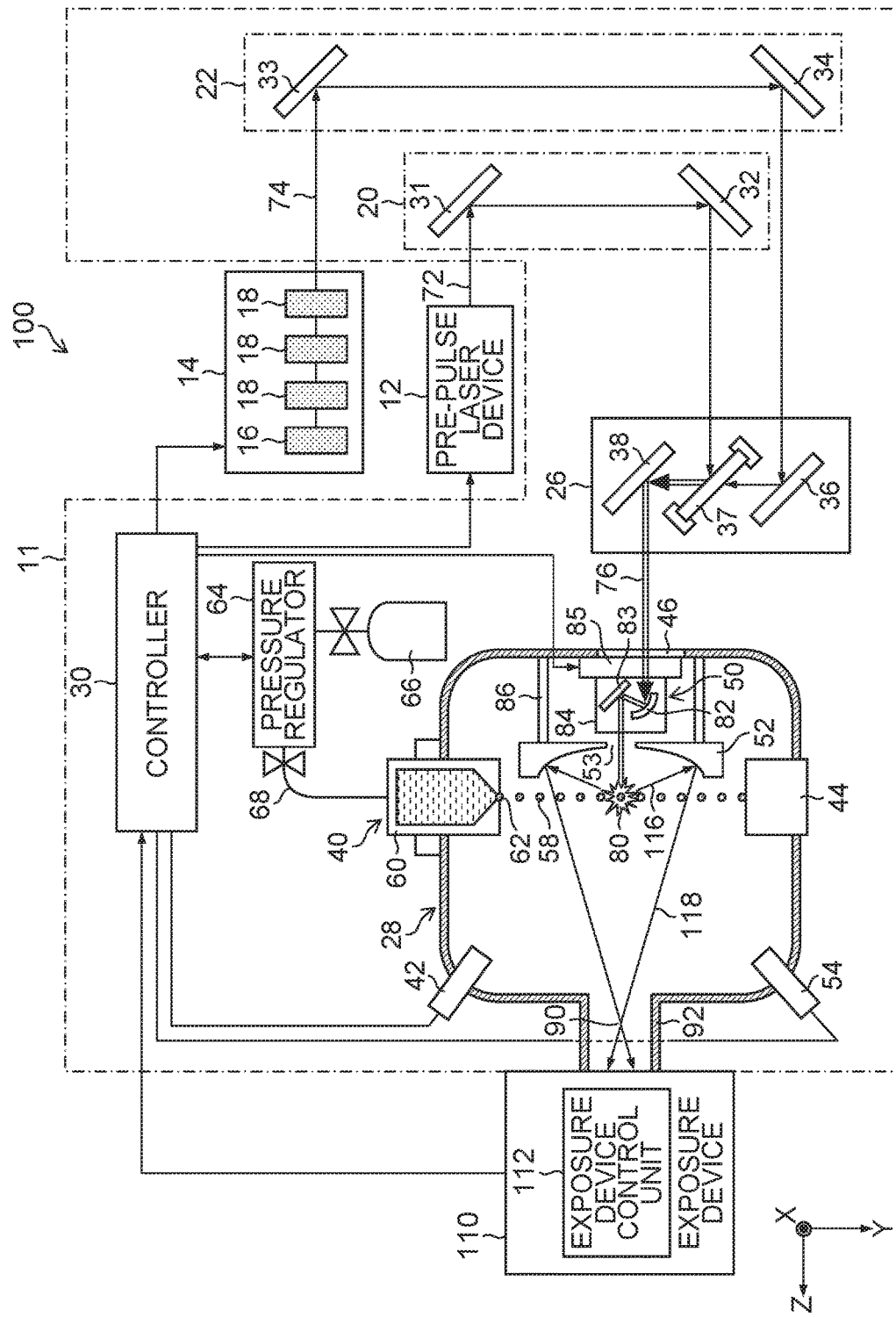
FIG. 1 is a diagram schematically illustrating a configuration of an exemplary LPP type EUV light generation system.

1. Overall Description of Extreme Ultraviolet Light Generation System 1.1 Configuration FIG. 1 schematically illustrates a configuration of an exemplary LPP type EUV light generation system 100. An EUV light generation device 11 may be used together with at least one laser device. The EUV light generation device 11 illustrated in FIG. 1 is used along with a pre-pulse laser device 12 and a main pulse laser device 14 as laser devices. In the present disclosure, a system including the EUV light generation device 11, the pre-pulse laser device 12, and the main pulse laser device 14 is referred to as an EUV light generation system 100.

Both or either one of the pre-pulse laser device 12 and the main pulse laser device 14 may be a master oscillator power amplifier (MOPA) system. The MOPA system includes a laser oscillator and at least one laser amplifier. As the pre-pulse laser device 12, a YAG laser device that outputs pulse laser light having a wavelength of 1.06 μm may be used, for example.

The main pulse laser device 14 is a $CO_2$ laser device, for example. The main pulse laser device 14 illustrated in FIG. 1 includes a master oscillator 16, an optical isolator not illustrated, and a $CO_2$ laser amplifier 18.

The master oscillator 16 outputs laser light including a wavelength of an amplification region of the $CO_2$ laser amplifier 18, with a given repetition frequency. As the master oscillator 16, a solid-state laser is adoptable. The wavelength of laser light, output from the master oscillator 16, is 10.59 μm, for example, and a repetition frequency of pulse oscillation is 100 kHz, for example.

The $CO_2$ laser amplifier 18 is disposed on an optical path of the laser light output from the master oscillator 16. While FIG. 1 illustrates a form including three $CO_2$ laser amplifiers 18, the main pulse laser device 14 may be configured to include n pieces of $CO_2$ laser amplifiers 18. "n" may be an integer of one or more.

The EUV light generation device 11 includes a first laser light transmission device 20, a second laser light transmission device 22, a beam combiner 26, a chamber 28, and a controller 30.

Each of the first laser light transmission device 20 and the second laser light transmission device 22 includes an optical element for defining a transmission state of laser light, and an actuator for regulating the position, posture, and the like of the optical element.

As an optical element for defining the travel direction of the laser light output from the pre-pulse laser device 12, the first laser light transmission device 20 includes a first high reflective mirror 31 and a second high reflective mirror 32. Laser light output from the pre-pulse laser device 12 is called pre-pulse laser light 72. The first laser light transmission device 20 may form a laser optical path for guiding the pre-pulse laser light 72 to the beam combiner 26.

As an optical element for defining the travel direction of the laser light output from the main pulse laser device 14, the second laser light transmission device 22 includes a third high reflective mirror 33 and a fourth high reflective mirror 34. Laser light output from the main pulse laser device 14 is called main pulse laser light 74. The second laser light transmission device 22 may form a laser optical path guiding the main pulse laser light 74 to the beam combiner 26.

The beam combiner 26 includes a fifth high reflective mirror 36, a dichroic mirror 37, and a sixth high reflective mirror 38. The fifth high reflective mirror 36 reflects the main pulse laser light 74 transmitted via the second laser light transmission device 22 toward the dichroic mirror 37.

The dichroic mirror 37 is an optical element that reflects the pre-pulse laser light 72 and transmits the main pulse laser light 74. The dichroic mirror 37 may be formed such that a diamond base plate is coated with a film that reflects the pre-pulse laser light 72 at a high reflectance and transmits the main pulse laser light 74 at a high transmittance. The dichroic mirror 37 transmits the main pulse laser light 74 reflected by the fifth high reflective mirror 36 and reflects the pre-pulse laser light 72 transmitted via the first laser light transmission device 20, to thereby make the optical paths of the two types of light substantially match. Making optical paths of a plurality of types of light substantially match is called multiplexing.

The sixth high reflective mirror 38 reflects the pulse laser light 76 multiplexed by the dichroic mirror 37, and defines the travel direction of the pulse laser light 76. The pulse laser light 76 is formed of both or either one of the pre-pulse laser light 72 and the main pulse laser light 74. The beam combiner 26 may be fixed to the chamber 28.

The chamber 28 is a sealable container. The chamber 28 may be formed in a hollow spherical shape or a hollow cylindrical shape, for example. The chamber 28 includes a droplet generator 40, a droplet detection sensor 42, and a droplet recovery unit 44. The wall of the chamber 28 has a window 46 for introducing the pulse laser light 76 into the chamber 28. The pulse laser light 76 output from the beam combiner 26 passes through the window 46.

Inside the chamber 28, a laser light condensing optical system 50 and an EUV light condensing mirror 52 are disposed. Further, the wall of the chamber 28 is also provided with an EUV light sensor 54.

The droplet generator 40 feeds a droplet 58 of a target substance to the inside of the chamber 28, and is mounted so as to penetrate a wall of the chamber 28, for example. The material of the target substance may include, but not limited to, tin, terbium, gadolinium, lithium, xenon, or a combination of any two or more of them.

The droplet generator 40 includes a tank 60 for storing a target substance, a nozzle 62 having a nozzle hole for outputting the target substance, and a piezoelectric element that is not illustrated and is disposed at the nozzle 62. The tank 60 may be formed to have a hollow cylindrical shape. The hollow tank 60 contains the target substance therein. At least the inside of the tank 60 is made of a material resisting chemical reaction with the target substance. As the materials resisting chemical reaction with tin that is an example of the target substance, SiC, $SiO_2$, $Al_2O_3$, molybdenum, tungsten, tantalum, or the like may be used. To the outer side face of the tank 60, a heater and a temperature sensor that are not illustrated may be fixed.

The EUV light generation device 11 includes a pressure regulator 64 that regulates the pressure in the tank 60. The pressure regulator 64 is disposed in a pipe 68 between an inert gas supply unit 66 and the tank 60. The inert gas supply unit 66 may include a gas cylinder filled with inert gas such as helium, argon, or the like. The inert gas supply unit 66 may supply inert gas into the tank 60 via the pressure regulator 64.

The pressure regulator 64 is linked to a discharge pump not illustrated. The pressure regulator 64 is able to discharge gas in the tank 60 by operating a discharge pump not illustrated. The pressure regulator 64 may include therein a solenoid valve for supplying and discharging air, a pressure sensor that are not illustrated, and the like. The pressure regulator 64 may detect pressure inside the tank 60 with use of the pressure sensor. The pressure regulator 64 is connected with the controller 30.

The nozzle 62 is provided on the bottom face of the cylindrical tank 60. A plasma generation region 80 in the chamber 28 is positioned on an extended line in the center axis direction of the nozzle 62. In FIG. 1, a three-dimensional XYZ orthogonal coordinate system is introduced, and the center axis direction of the nozzle 62 is assumed to be a Y axis direction, for convenience of explanation. A direction of deriving EUV light from the chamber 28 toward an exposure device 110 is assumed to be a Z axis direction, and a direction perpendicular to the sheet surface of FIG. 1 is assumed to be an X axis direction.

A nozzle hole of the nozzle 62 is formed in a shape such that a molten target substance is jetted into the chamber 28. As an example of a target substance to be output from the nozzle hole, liquid tin may be adopted.

The droplet generator 40 may form a droplet 58 in a continuous jet method, for example. In the continuous jet method, a standing wave is given to a flow of jetted target by vibrating the nozzle 62, whereby the target substance is separated cyclically. The separated target substance may form a free interface by the own surface tension to thereby form a droplet 58.

The piezoelectric element that is not illustrated and is disposed on the nozzle 62 may serve as an element constituting a droplet forming mechanism that applies vibration necessary for forming the droplet 58, to the nozzle 62. The piezoelectric element is connected with the piezoelectric power source not illustrated. The piezoelectric power source supplies electric power to the piezoelectric element. The piezoelectric power source is connected with the controller 30, and the power supply to the piezoelectric element is controlled by the controller 30.

The droplet detection sensor 42 detects any or a plurality of presence, trajectory, position, and velocity of the droplet 58 output into the chamber 28. The droplet detection sensor 42 may be configured of any of a photodiode, a photodiode array, an avalanche photodiode, a multiplier phototube, a multi-pixel photon counter, an image sensor such as a charge-coupled device (CCD) camera, and an image intensifier.

The droplet detection sensor 42 may adopt a configuration having a light source unit and a light receiving unit, for example. The light source unit and the light receiving unit may be disposed at opposite positions across the trajectory of the droplet 58. While FIG. 1 describes only one droplet detection sensor 42, a plurality of droplet detection sensors 42 may be disposed in the chamber 28.

The laser light condensing optical system 50 condenses the pulse laser light 76, made incident on the chamber 28 via the window 46, on the plasma generation region 80. The laser light condensing optical system 50 includes a high-reflective off-axis paraboloid mirror 82, a high-reflective planar mirror 83, a mirror support plate 84, and a triaxial stage 85. The high-reflective off-axis paraboloid mirror 82 is held by a mirror holder not illustrated, and is fixed to the mirror support plate 84. The high-reflective planar mirror 83 is held by a mirror holder not illustrated, and is fixed to the mirror support plate 84.

The triaxial stage 85 is a stage that can move the mirror support plate 84 in triaxial directions of an X axis, a Y axis, and a Z axis orthogonal to each other. The triaxial stage 85 is electrically driven according to an instruction from the controller 30.

The EUV light condensing mirror 52 is supported by the support member 86. The support member 86 is fixed to the inner wall of the chamber 28. The EUV light condensing mirror 52 has a spheroidal reflection surface. The EUV light condensing mirror 52 may have a first focus and a second focus. On the surface of the EUV light condensing mirror 52, a multilayer reflection film in which molybdenum and silicon are alternately layered is formed, for example. The EUV light condensing mirror 52 is disposed such that the first focus thereof is positioned in the plasma generation region 80 and the second focus thereof is positioned at an intermediate focusing point (IF) 90, for example. A center portion of the EUV light condensing mirror 52 has a through hole 53 through which pulse laser light 76 passes.

The EUV light sensor 54 is a sensor for measuring energy of the EUV light generated in the chamber 28. While FIG. 1 illustrates only one EUV light sensor 54, a plurality of EUV light sensors 54 may be disposed on the wall of the chamber 28.

The droplet recovery unit 44 is disposed on an extended line in a travel direction of the droplet 58 output from the droplet generator 40 into the chamber 28. In FIG. 1, the dropping direction of the droplet 58 is a direction parallel to the Y axis, and the droplet recovery unit 44 is disposed at an opposite position in the Y axis direction with respect to the droplet generator 40.

The chamber 28 is provided with a discharge device and a pressure sensor that are not illustrated. The chamber 28 is connected with a gas supply device not illustrated.

The EUV light generation device 11 also includes a connecting section 92 that allows the inside of the chamber 28 and the inside of the exposure device 110 to communicate with each other. The inside of the connecting section 92 is provided with a wall having an aperture not illustrated. The aperture not illustrated is positioned at the intermediate focusing point 90 that is the second focus position of the EUV light condensing mirror 52.

The exposure device 110 includes an exposure device control unit 112 which is connected with the controller 30.

The controller 30 presides over the control of the entire EUV light generation system 100. The controller 30 is connected with the pre-pulse laser device 12, the main pulse laser device 14, the droplet generator 40, the pressure regulator 64, the droplet detection sensor 42, the EUV light sensor 54, and the triaxial stage 85. The controller 30 is also connected with a discharge device, a pressure sensor, a gas supply control valve that are not illustrated, and the like.

The controller 30 generates a laser trigger signal for designating laser emission timing of each of the main pulse laser device 14 and the pre-pulse laser device 12.

The controller 30 controls operation of the droplet generator 40. The controller 30 also controls output timing of the laser light of each of the main pulse laser device 14 and the pre-pulse laser device 12, based on a detection signal from the droplet detection sensor 42. The controller 30 generates a laser trigger signal for designating laser light output timing of each of the main pulse laser device 14 and the pre-pulse laser device 12.

The controller 30 controls, for example, the cycle of outputting the droplet 58, the velocity of the droplet 58, and the like based on the detection result of the droplet detection sensor 42. The controller 30 also controls laser oscillation timing of each of the pre-pulse laser device 12 and the main pulse laser device 14, a travel direction of each of the pre-pulse laser light 72 and the main pulse laser light 74, the light condensing position of the pulse laser light 76, and the like. The aforementioned various types of control are mere examples. Other types of control may be added as required, or part of the control functions may be omitted.

In the present disclosure, control devices such as the controller 30 and the exposure device control unit 112 can be realized by a combination of hardware and software of one or a plurality of computers. Software has the same meaning as a program. A programmable controller is included in the concept of computer.

It is also possible to realize functions of a plurality of control devices by one control device. Further, in the present disclosure, the controller 30, the exposure device control unit 112, and the like may be connected with each other over a communication network such as a local area network or the Internet. In a distributed computing environment, a program unit may be stored in memory storage devices of both local and remote.

1.2 Operation

Operation of the exemplary LPP type EUV light generation system 100 will be described with reference to FIG. 1. The controller 30 controls discharge by a discharge device not illustrated and gas supply from a gas supply device such that the pressure in the chamber 28 falls within a given range, based on a detection value of a pressure sensor that is not illustrated and is attached to the chamber 28. The given range of the pressure in the chamber 28 is a value between several pascals [Pa] to several hundreds of pascals [Pa], for example.

The controller 30 controls a heater that is not illustrated and is provided in the tank 60 to thereby heat the target substance in the tank 60 to have a predetermined temperature equal to or higher than the melting point. When the target substance is tin, the controller 30 controls the heater not illustrated, to thereby heat the tin in the tank 60 up to a predetermined temperature that is equal to or higher than the melting point to thereby control the temperature of the tin in the tank 60. The predetermined temperature is for example within a range from 250° C. to 290° C. The melting point of tin is 232° C.

The controller 30 also controls the pressure regulator 64 such that the pressure in the tank 60 becomes a pressure that can output a jet of liquid tin from the nozzle 62 at a predetermined velocity.

Next, the controller 30 transmits a signal to supply voltage of a given waveform to a piezoelectric element not illustrated so as to generate the droplet 58. The piezoelectric element oscillates when the voltage of the given waveform is supplied to the piezoelectric element. As a result, regular disturbance is given to the jets of molten tin output from the nozzle hole. Thereby, the molten tin in the form of a jet is divided into the droplets 58, and the droplets 58 having almost the same volume can be generated cyclically.

The droplet detection sensor 42 includes a light source unit and a light receiving unit that are not illustrated, for example. The illumination light output from the light source unit passes through a given position on the droplet trajectory on which the droplet 58 travels, and is received by the light receiving unit.

In synchronization with the droplet 58 passing through the given position, the light intensity of light received by the light receiving unit drops. A change in the light intensity is detected by the light receiving unit, and the detection result is output from the light receiving unit to the controller 30.

When the pulse laser light 76 is radiated to the droplet 58, the controller 30 generates a droplet detection signal at timing when the detection signal obtained from the droplet detection sensor 42 becomes lower than a threshold voltage. The controller 30 outputs a light emission trigger signal delayed by a given time from the droplet detection signal, to the pre-pulse laser device 12 and the main pulse laser device 14. The delay time set to each of the pre-pulse laser device 12 and the main pulse laser device 14 is set such that the pulse laser light 76 is radiated to the droplet 58 when the droplet 58 reaches the plasma generation region 80.

When a light emission trigger signal is input to the pre-pulse laser device 12, the pre-pulse laser light 72 is output from the pre-pulse laser device 12. When a light emission trigger signal is input to the main pulse laser device 14, the main pulse laser light 74 is output from the main pulse laser device 14. The power of the laser light output from the main pulse laser device 14 reaches several kW to several tens kW. The pre-pulse laser light 72 having been output from the pre-pulse laser device 12 passes through the window 46 via the first laser light transmission device 20 and the beam combiner 26, and is input to the chamber 28. The main pulse laser light 74 having been output from the main pulse laser device 14 passes through the window 46 via the second laser light transmission device 22 and the beam combiner 26, and is input to the chamber 28.

The pulse laser light 76 including the pre-pulse laser light 72 and the main pulse laser light 74 is condensed by the laser light condensing optical system 50, and is radiated to the droplet 58 that reached the plasma generation region 80.

The droplet 58 is irradiated with at least one pulse included in the pulse laser light 76. The droplet 58 irradiated with the pulse laser light 76 is made into plasma, and radiation light 116 is emitted from the plasma. EUV light 118 included in the radiation light 116 is selectively reflected by the EUV light condensing mirror 52. The EUV light 118 reflected by the EUV light condensing mirror 52 is condensed at the intermediate focusing point 90 and is output to the exposure device 110.

One droplet 58 may be irradiated with a plurality of pulses included in the pulse laser light 76. In this example, one droplet 58 is irradiated with the pulse of the pre-pulse laser light 72 and the pulse of the main pulse laser light 74.

The droplet recovery unit 44 recovers the droplet 58 not irradiated with the pulse laser light 76 and passing through the plasma generation region 80, or part of the droplet not dispersed even with irradiation of the pulse laser light 76.

The EUV light sensor 54 measures energy of the EUV light generated in the chamber 28. The controller 30 calculates the gravity center value of plasma and the driving amount of the laser light condensing optical system 50 required for correction from a measurement value obtained from the EUV light sensor 54, and sends a driving command to the triaxial stage 85. The triaxial stage 85 is driven according to the driving command from the controller 30, and the pulse laser light 76 is condensed on the predetermined position.

2. Terms

"Target" is an object to be irradiated with laser light introduced to the chamber. The target irradiated with laser light is made into plasma and emits EUV light. A droplet made of a liquid target substance is a form of the target. The target serves as the source of plasma.

"Plasma light" is radiation light emitted from plasma. The radiation light emitted from the target made into plasma is a form of plasma light. The radiation light includes EUV light.

The expression "EUV light" is an abbreviation of "extreme ultraviolet light".

"YAG" is an abbreviation of "Yttrium Aluminum Garnet". In a YAG laser device, YAG crystal is used as a laser medium in an oscillator and/or amplifier. YAG crystal may be one doped with an element such as neodymium (Nd).

"$CO_2$" represents carbon dioxide. A $CO_2$ laser device uses $CO_2$ gas as a laser medium in an oscillator and/or amplifier.

A term "optical element" has the same meaning as an optical component or an optical member.

3. Problem

Figure 2:
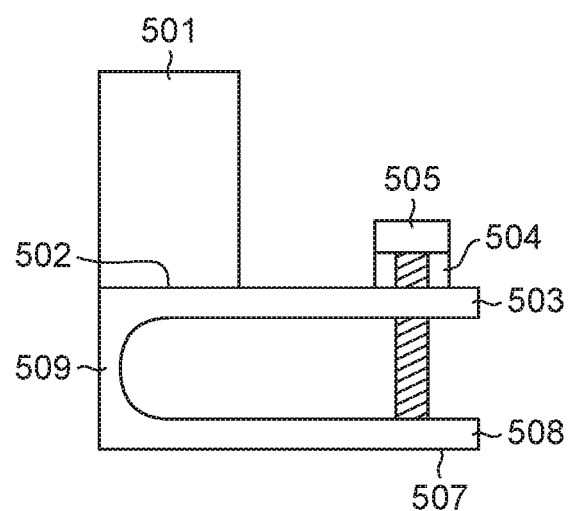
FIG. 2 is a front view of an exemplary angle adjustment mechanism of an optical element.
Figure 3:
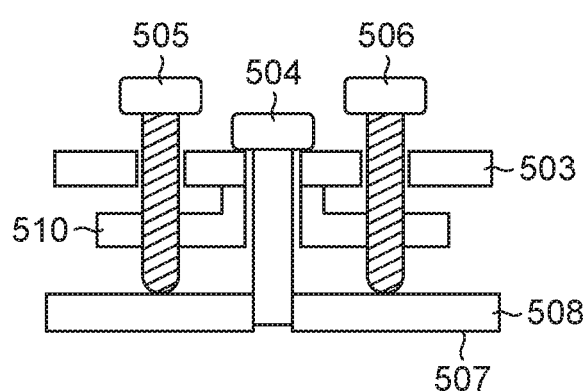
FIG. 3 is a cross-sectional side view of another exemplary angle adjustment mechanism of an optical element.

FIGS. 2 and 3 are drawings in which the configurations illustrated in "FIG. 2(a)" and "FIG. 1" of Japanese Utility Model Application Laid-Open No. 05-004113 are copied. However, the reference signs denoting the members are different from those described therein. An angle adjustment mechanism illustrated in each of FIGS. 2 and 3 has a hinge structure in which a base mounting plate 508 and an optical component mounting plate 503 are connected via a connection part 509. An optical component 501 adheres to the optical component mounting plate 503 by an adhesive portion 502. The bottom surface of the base mounting plate 508 is a base mounting surface 507. A drawing screw 504 meshes with an internal thread of the base mounting plate 508. The drawing screw 504 applies a force to bend the optical component mounting plate 503 in a direction of drawing it to the base mounting plate 508, using the connection part 509 as a fulcrum. A set screw 505 illustrated in FIG. 2 meshes with an internal thread of the optical component mounting plate 503 to press the base mounting plate 508. The set screws 505 and 506 illustrated in FIG. 3 mesh with internal threads of a caulking plate 510 to press the base mounting plate 508.

This means that the angle adjustment mechanism illustrated in FIGS. 2 and 3 is a mechanism for adjusting the angle of the optical component 501 using the connection part 509 as the fulcrum by deforming the optical component mounting plate 503 with use of the drawing screw 504 and the set screw 505. To adjust the angle of the optical component 501, the drawing screw 504 and the set screw 505 are fastened.

However, when the drawing screw 504 is fastened to thereby deform the optical component mounting plate 503, the mesh portion of the thread and the bearing surface of the bolt may not be parallel, and an excessive force may be applied. Accordingly, it is highly likely that screw galling is caused.

4. First Embodiment 4.1 Configuration

Figure 4:
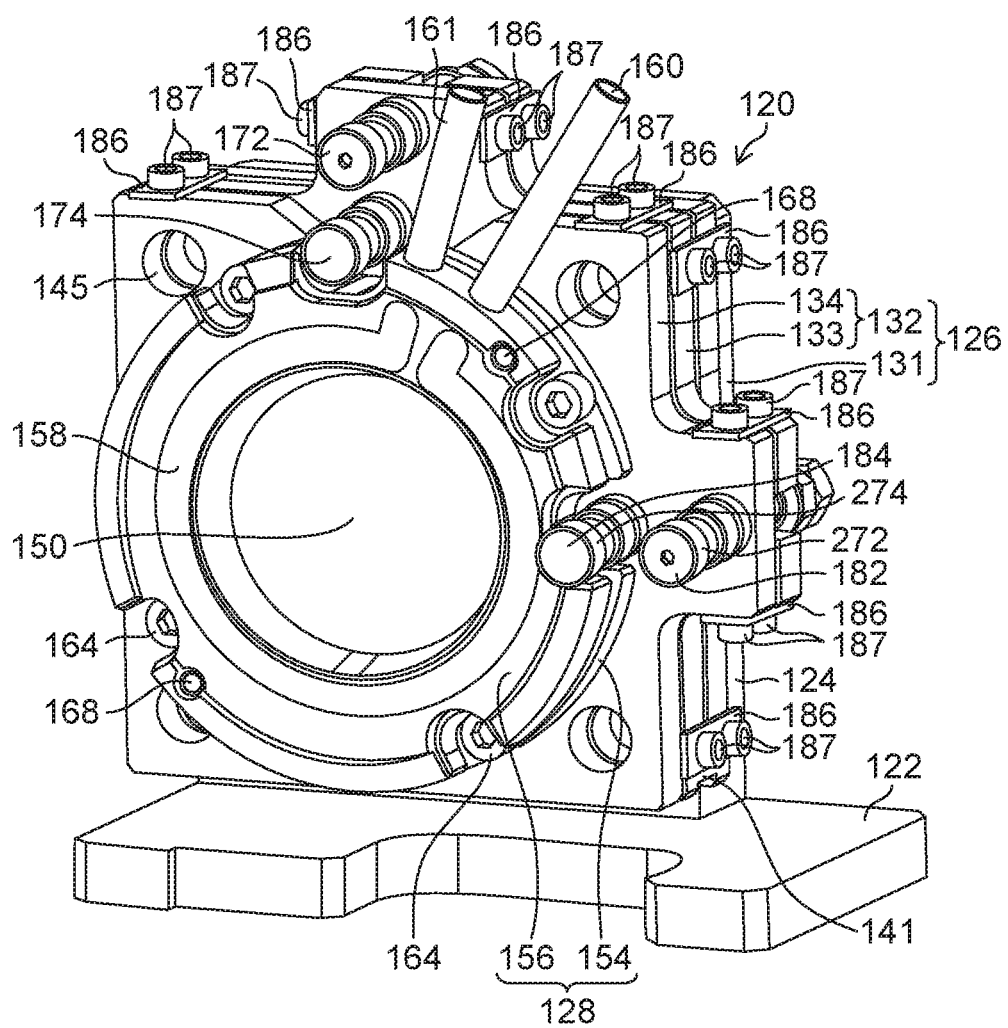
FIG. 4 is a perspective view of an optical element angle adjustment device according to a first embodiment.
Figure 5:
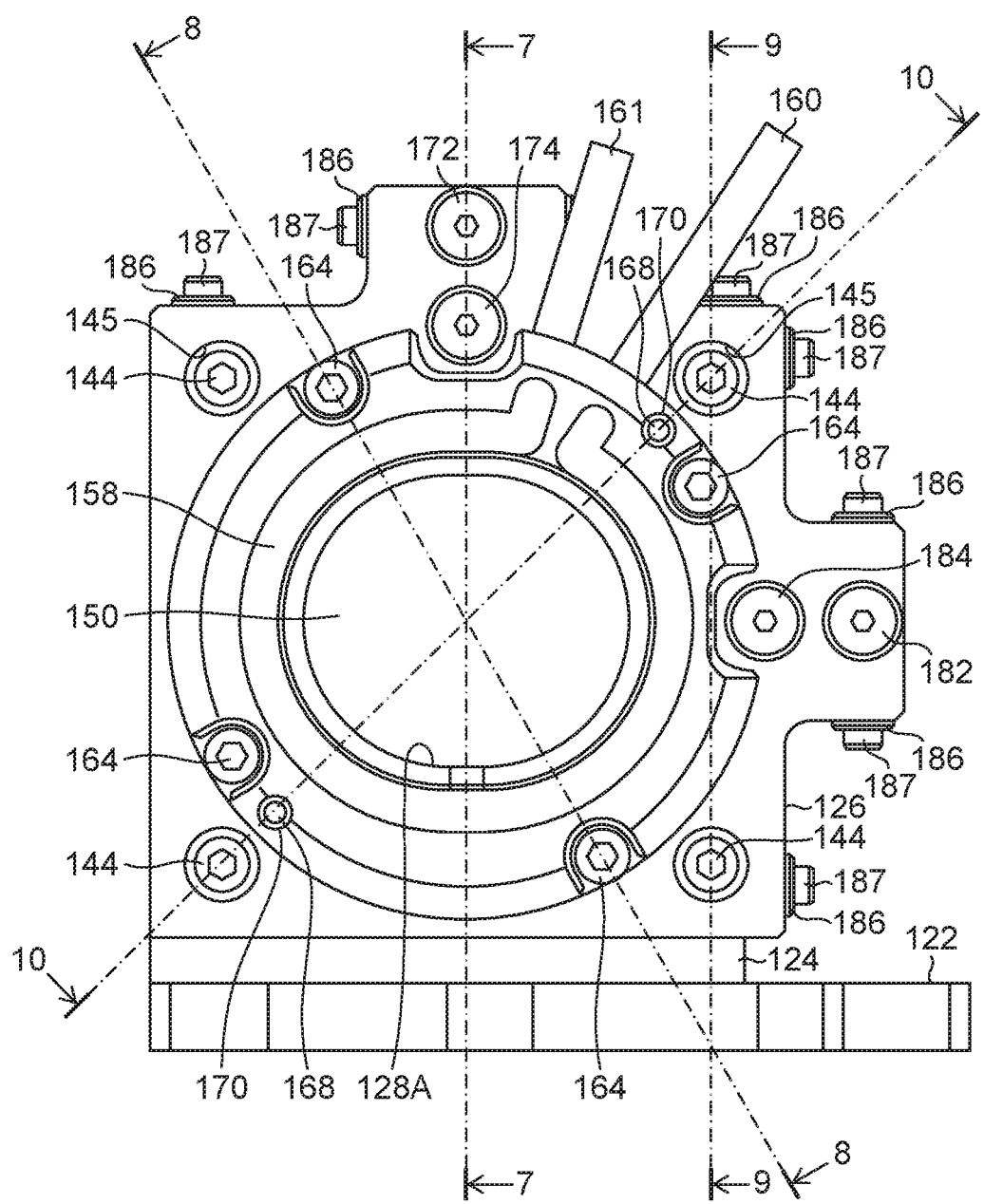
FIG. 5 is a front view of the optical element angle adjustment device according to the first embodiment.
Figure 6:
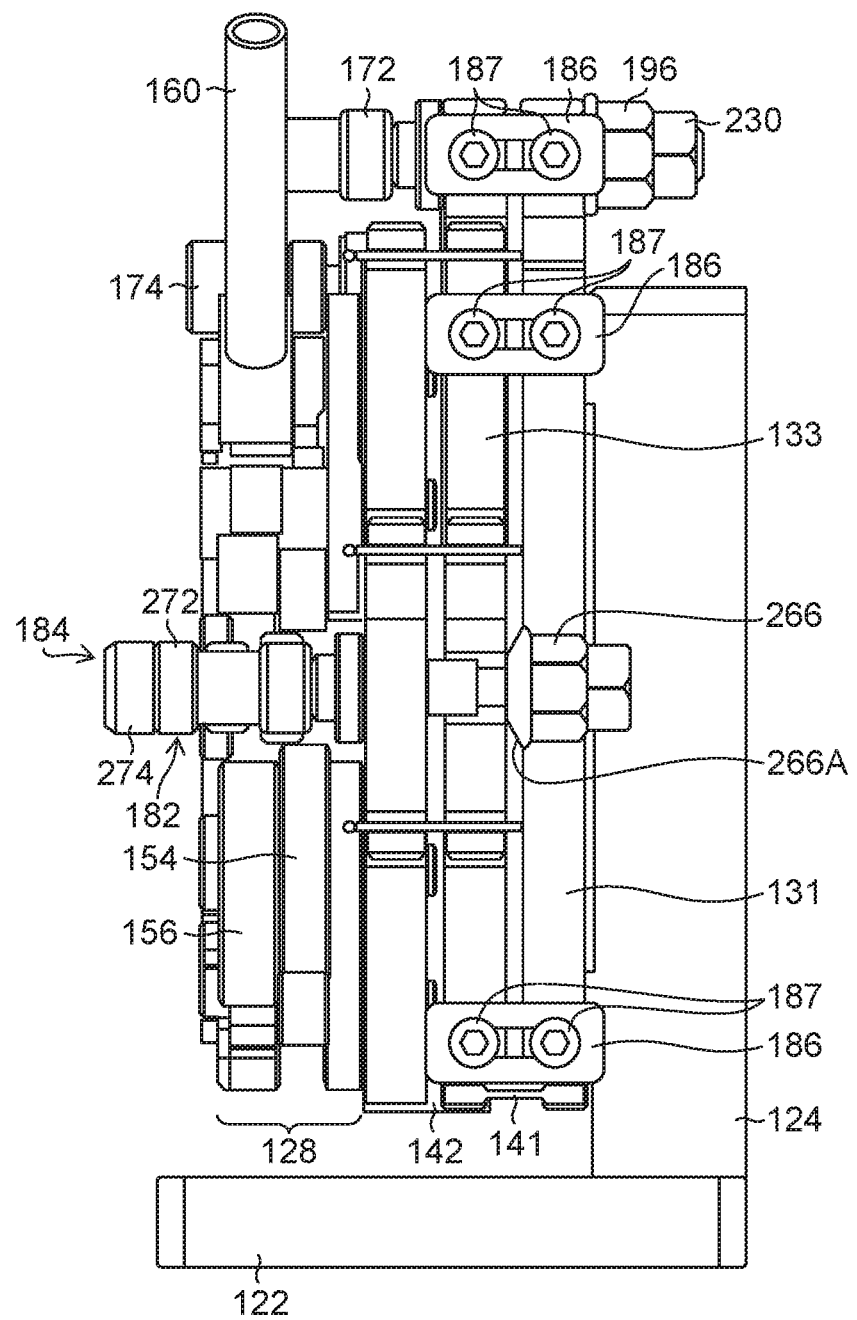
FIG. 6 is a side view of the optical element angle adjustment device according to the first embodiment.
Figure 7:
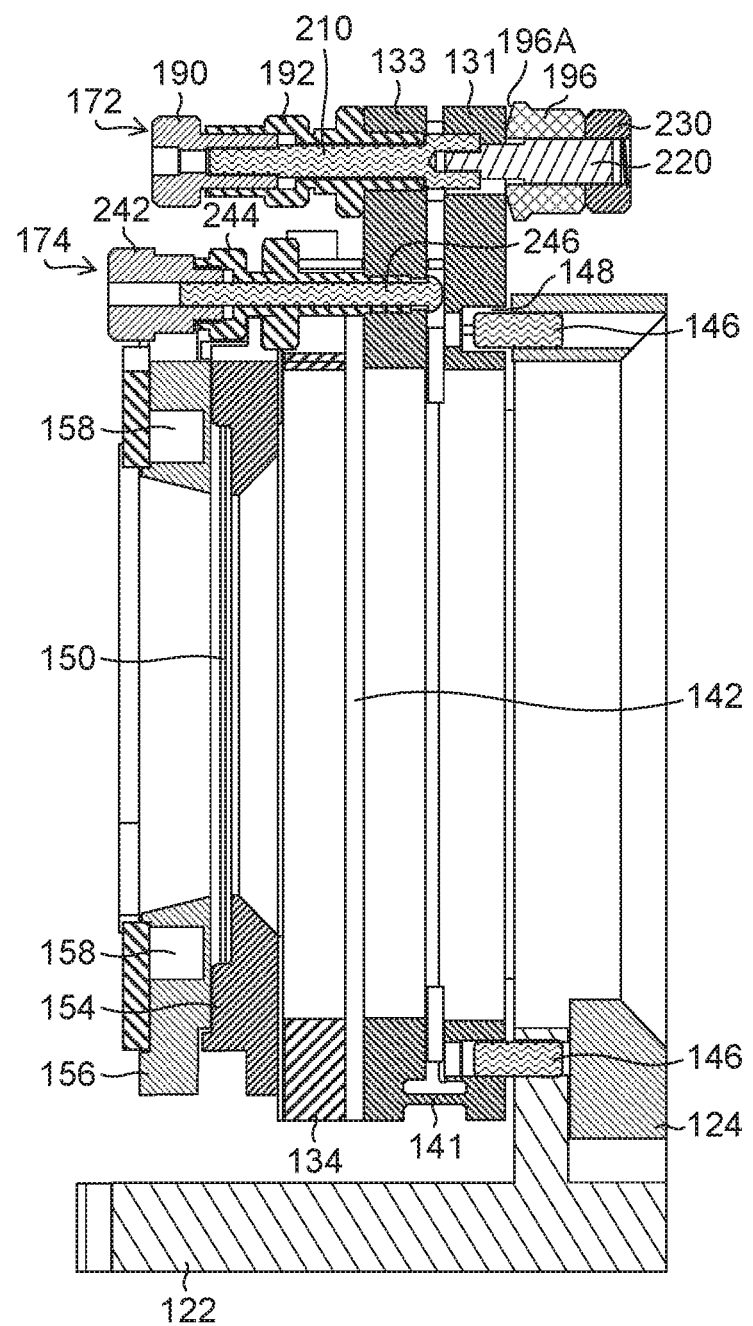
FIG. 7 is a cross-sectional view taken along a line 7-7 of FIG. 5.
Figure 8:
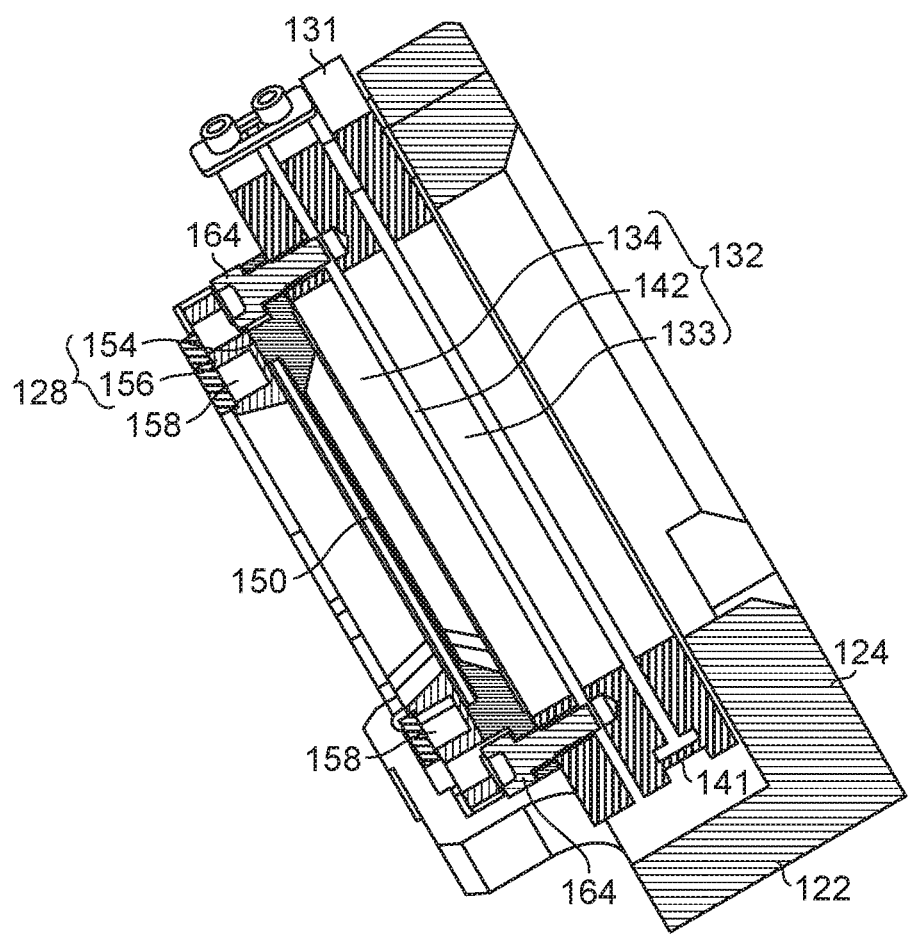
FIG. 8 is a cross-sectional view taken along a line 8-8 of FIG. 5.
Figure 9:
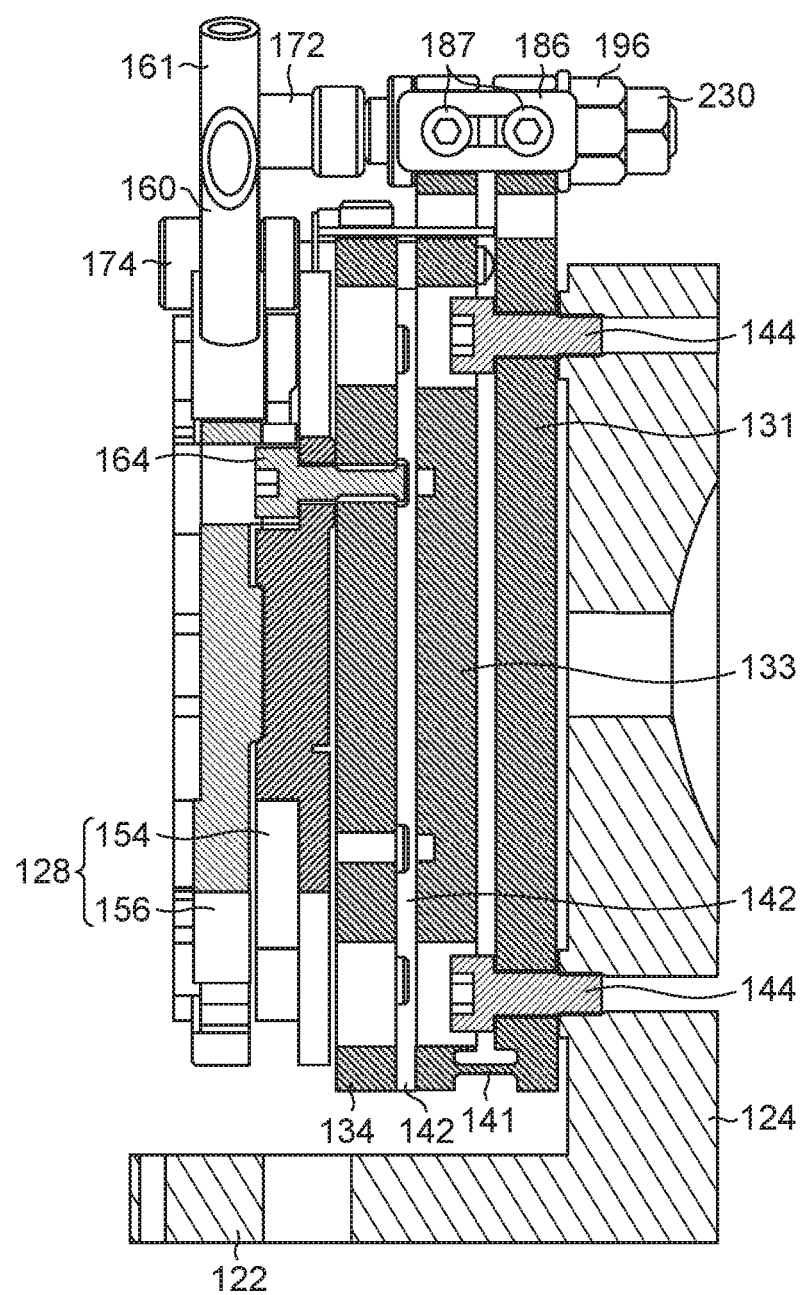
FIG. 9 is a cross-sectional view taken along a line 9-9 of FIG. 5.
Figure 10:
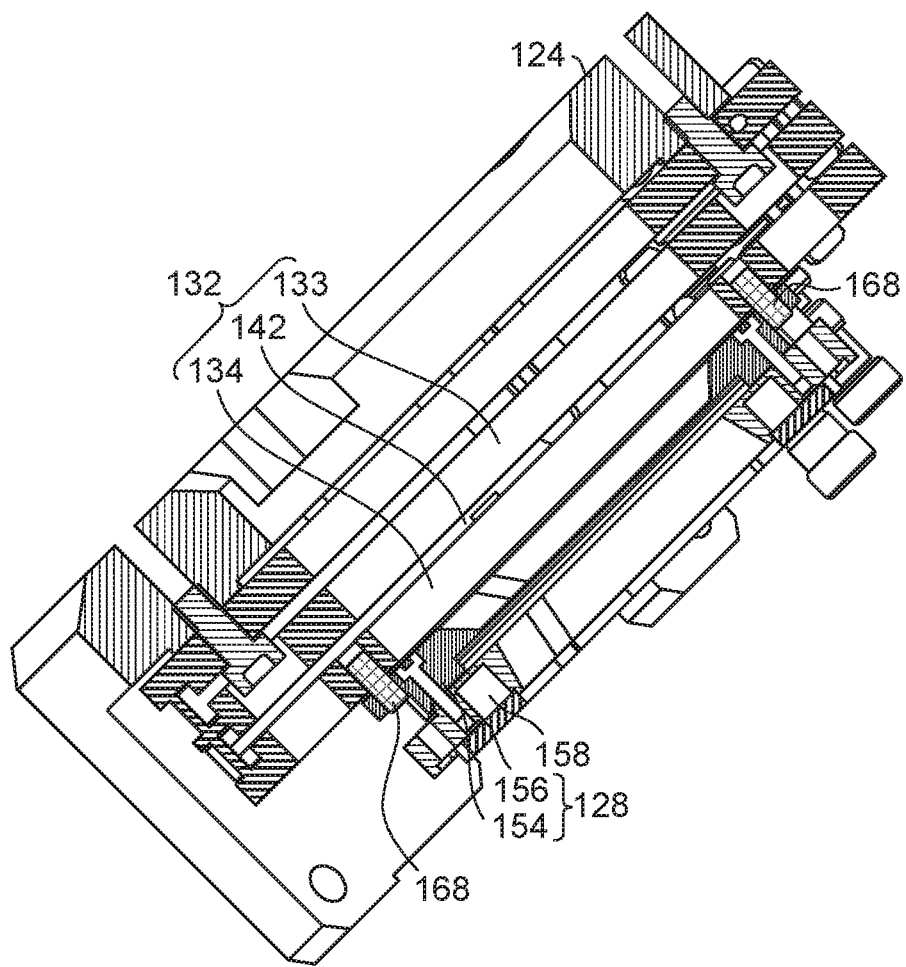
FIG. 10 is a cross-sectional view taken along a line 10-10 of FIG. 5.

FIG. 4 is a perspective view of an optical element angle adjustment device 120 according to a first embodiment. The optical element angle adjustment device 120 illustrated in FIG. 4 may be used as a mechanism for adjusting the flap angle of the dichroic mirror 37 used in the beam combiner 26 described in FIG. 1, for example. FIG. 5 is a front view of the optical element angle adjustment device 120. FIG. 6 is a right side view of the optical element angle adjustment device 120. FIG. 7 is a cross-sectional view taken along a line 7-7 of FIG. 5. FIG. 8 is a cross-sectional view taken along a line 8-8 of FIG. 5. FIG. 9 is a cross-sectional view taken along a line 9-9 of FIG. 5. FIG. 10 is a cross-sectional view taken along a line 10-10 of FIG. 5. For the convenience of explanation, it is assumed that the horizontal direction in the front view of FIG. 5 is an x axis direction, and that the vertical direction in FIG. 5 is a y axis direction. The x axis direction and the y axis direction defined in FIG. 5 can be defined irrelevantly to the X axis direction and the Y axis direction defined in FIG. 1, and may or may not coincide with the X axis direction and the Y axis direction.

As illustrated in FIGS. 4 to 10, the optical element angle adjustment device 120 includes an optical element holder holding base 122, an optical element holder fixing plate 124, a hinge-type adjustment plate 126, and a cooling holder 128.

The optical element holder fixing plate 124 stands perpendicular to the plate of the optical element holder holding base 122. For example, the optical element holder holding base 122 and the optical element holder fixing plate 124 are configured as different components, and the optical element holder fixing plate 124 is connected and fixed to the optical element holder holding base 122 with use of a fastening tool such as a bolt. Alternatively, the optical element holder holding base 122 and the optical element holder fixing plate 124 may be configured as a single component in which they are integrally formed.

The hinge-type adjustment plate 126 includes a first plate 131, a second plate 132, and a first hinge 141. The second plate 132 faces the first plate 131, and is connected with the first plate 131 via the first hinge 141.

The second plate 132 of the present example is a structure including a third plate 133, a fourth plate 134, and a second hinge 142. The fourth plate 134 faces the third plate 133, and is connected with the third plate 133 via the second hinge 142. The third plate 133 is connected with the first plate 131 via the first hinge 141.

The turning axis of the first hinge 141 and the turning axis of the second hinge 142 are orthogonal to each other. This means that the first hinge 141 extends along the x axis direction, and serves as a turning axis in a direction parallel to the x axis direction. The second hinge 142 extends along the y axis direction, and serves as a turning axis in a direction parallel to the y axis direction. The "turning axis" may also be referred to as a turning fulcrum.

Figure 11:
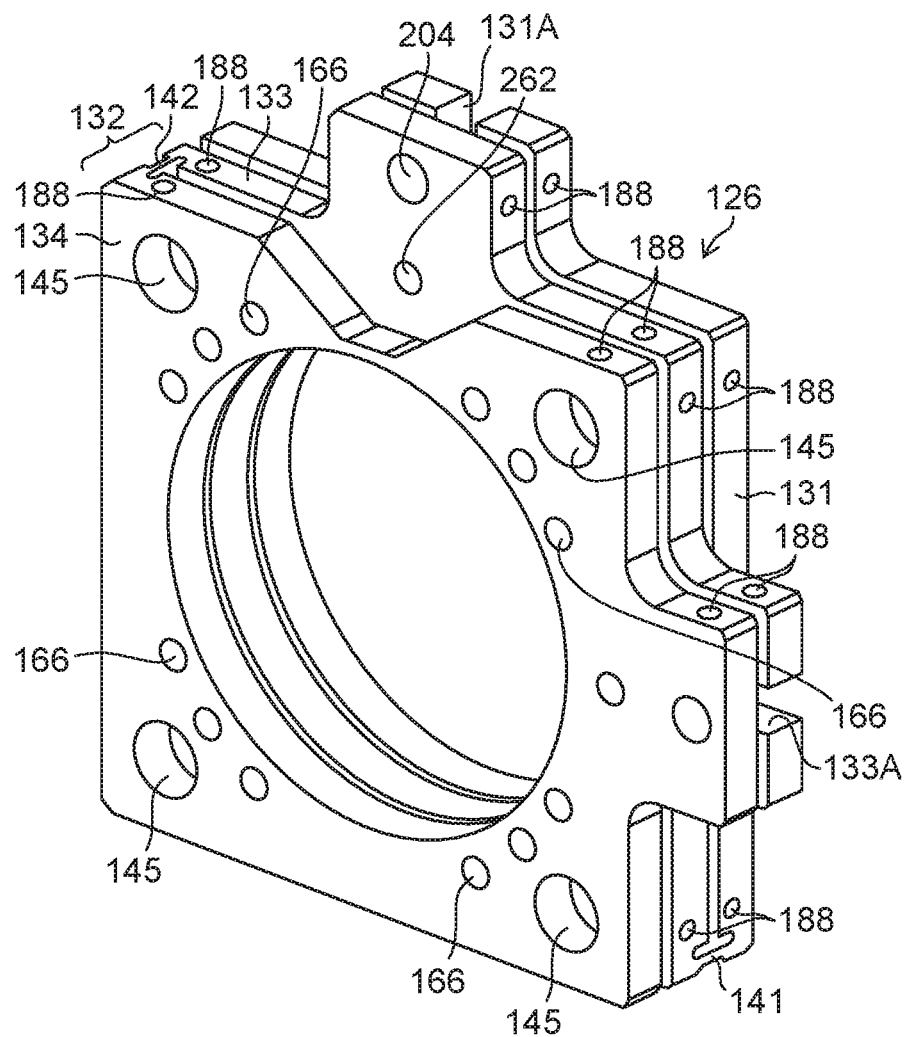
FIG. 11 is a perspective view of a hinge-type adjustment plate.
Figure 12:
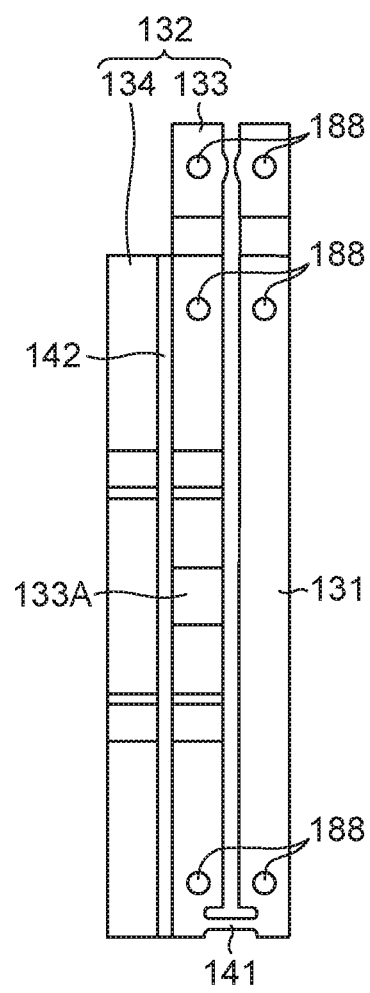
FIG. 12 is a side view of the hinge-type adjustment plate.
Figure 13:
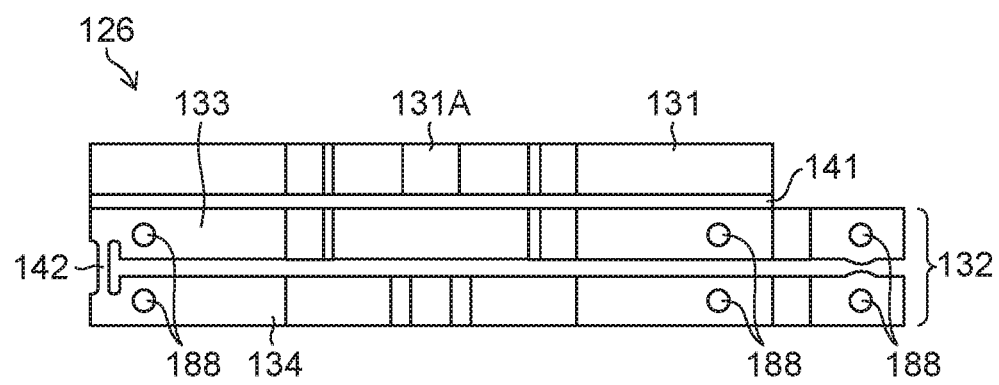
FIG. 13 is a top view of the hinge-type adjustment plate.
Figure 14:
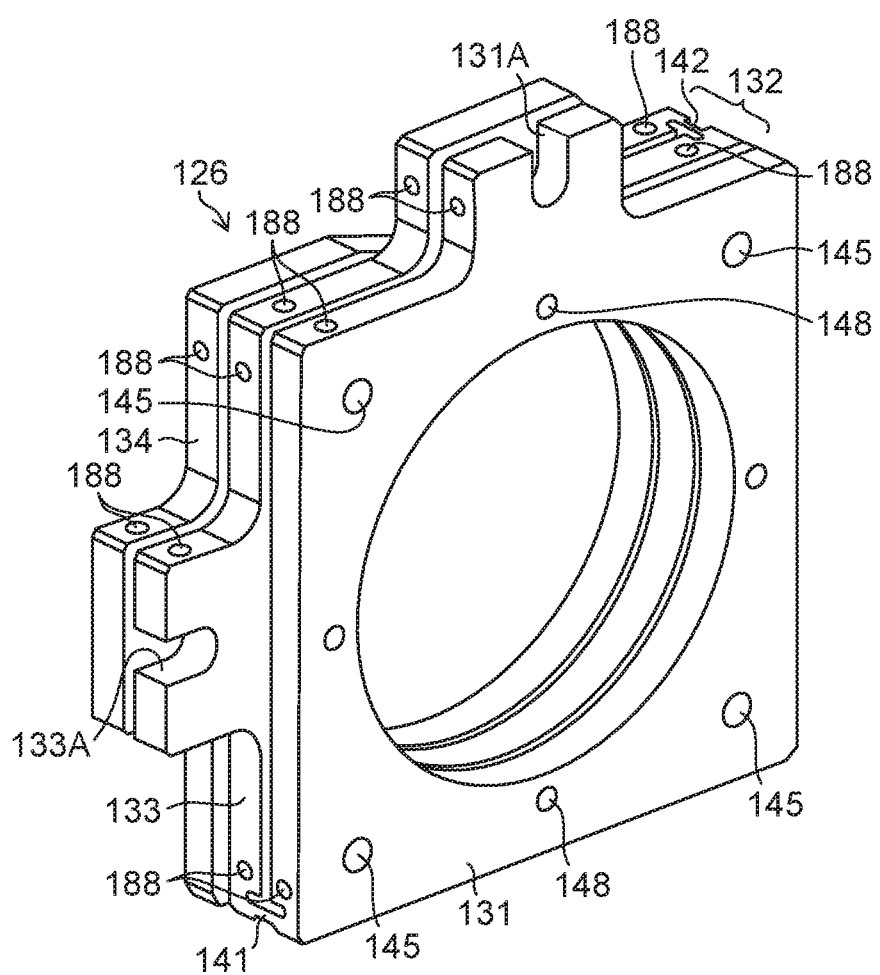
FIG. 14 is a perspective view of the hinge-tytype adjustment plate.

FIG. 11 is a perspective front view of the hinge-type adjustment plate 126. FIG. 12 is a right-side view of the hinge-type adjustment plate 126. FIG. 13 is a top view of the hinge-type adjustment plate 126. FIG. 14 is a perspective rear view of the hinge-type adjustment plate 126. As illustrated in FIGS. 11 to 14, the hinge-type adjustment plate 126 is a structure in which the first plate 131, the first hinge 141, the third plate 133, the second hinge 142, and the fourth plate 134 are integrally connected. The hinge-type adjustment plate 126 is configured as an inseparable single component. The hinge-type adjustment plate 126 is made of extra super duralumin called A7075 in the Japanese Industrial Standard (JIS), for example.

The first hinge 141 connects lower end portions of the first plate 131 and the third plate 133. The first hinge 141 is a connection part in a thin plate shape extending to have a length almost similar to the lower sides of the first plate 131 and the third plate 133 along a direction parallel to the x axis direction. The first hinge 141 is an elastically deformable elastic hinge. The hinge-type adjustment plate 126 is deformable in a direction that the space between the first plate 131 and the second plate 132 is closed or opened, using the first hinge 141 as the turning axis. In the present example, the space between the first plate 131 and the second plate 132 means the space between the first plate 131 and the third plate 133.

The second hinge 142 connects left end portions of the third plate 133 and the fourth plate 134. The second hinge 142 is a connection part in a thin plate shape extending to have a length almost similar to the left sides of the third plate 133 and the fourth plate 134 along a direction parallel to the y axis direction. The second hinge 142 is an elastically deformable elastic hinge. The hinge-type adjustment plate 126 is deformable in a direction that the space between the third plate 133 and the fourth plate 134 is closed or opened, using the second hinge 142 as the turning axis.

An opening/closing structure of the first plate 131 and the second plate 132, using the first hinge 141 as the turning axis, is called a first hinge structure. An opening/closing structure of the third plate 133 and the fourth plate 134, using the second hinge 142 as the turning axis, is called a second hinge structure.

As illustrated in FIGS. 4 and 5, the hinge-type adjustment plate 126 is fixed to the optical element holder fixing plate 124 with use of hinge fixing bolts 144. The hinge-type adjustment plate 126 has four through holes 145 for inserting four hinge fixing bolts 144.

Further, in order to regulate the mounting position of the hinge-type adjustment plate 126 to the optical element holder fixing plate 124, positioning pins 146 are used (see FIG. 7). The positioning pins 146 are projected at a plurality of positions on the side of mounting the hinge-type adjustment plate 126 of the optical element holder fixing plate 124. The first plate 131 has positioning holes 148 for fitting the positioning pins 146. The first plate 131 is positioned by the positioning pins 146, and is fixed unmovably to the optical element holder fixing plate 124 by the hinge fixing bolts 144.

The cooling holder 128 is a frame body holding an optical element 150, and has a mechanism of cooling the optical element 150. The cooling holder 128 includes a rear side plate 154 and a front side plate 156. The optical element 150 is held by being interposed between the rear side plate 154 and the front side plate 156. The front side plate 156 has a cooling flow passage 158 through which cooling water flows, a cooling water supply interface 160 for introducing the cooling water into the cooling flow passage 158, and a cooling water recovery interface 161 for recovering cooling water flowing through the cooling flow passage 158.

The cooling holder 128 is fixed to the hinge-type adjustment plate 126 with use of the cooling holder fixing bolt 164. The fourth plate 134 of the hinge-type adjustment plate 126 has an internal thread 166 to which the cooling holder fixing bolt 164 is screwed. In order to regulate the mounting position of the cooling holder 128 to the fourth plate 134, cooling holder positioning pins 168 are used (see FIG. 9). The cooling holder positioning pins 168 are projected at a plurality of positions on the side of mounting the cooling holder 128 of the fourth plate 134. The rear side plate 154 of the cooling holder 128 has cooling holder positioning holes 170 for fitting the cooling holder positioning pins 168.

The cooling holder 128 has a light transmission hole 128A for exposing the optical element 150. The light transmission hole 128A is formed as a long hole in which an opening width in the x axis direction is longer than an opening width in the y axis direction. It is desirable that the cooling holder 128 is formed to have contact area between the optical element 150 and the cooling holder 128 as large as possible to cool the optical element 150.

On the dichroic mirror 37 of the beam combiner 26, a beam is made incident obliquely. Accordingly, the beam is in an elliptic shape on the optical element 150. Therefore, the light transmission hole 128A of the cooling holder 128 of the present example is formed as a long hole.

The optical element angle adjustment device 120 includes a first hinge closing direction adjustment differential screw 172, a first hinge opening direction adjustment differential screw 174, a second hinge closing direction adjustment differential screw 182, and a second hinge opening direction adjustment differential screw 184, for adjusting the flap angle of the optical element 150.

The optical element angle adjustment device 120 also has a lock plate 186 for locking the adjustment position of the hinge-type adjustment plate 126 after the tilt angle is adjusted. A side face of each of the first plate 131, the third plate 133, and the fourth plate 134 has a lock plate connecting screw hole 188 for fixing the lock plate 186 with a bolt 187.

The first hinge closing direction adjustment differential screw 172 is disposed to penetrate the third plate 133 and the first plate 131. The first hinge closing direction adjustment differential screw 172 generates force to deform the first plate 131 and the second plate 132 of the first hinge structure using the first hinge 141 as the turning axis, in a direction of drawing them close to each other. The direction of drawing the first plate 131 and the second plate 132 close to each other is a direction of closing the first hinge 141. The direction of closing the first hinge 141 is referred to as a "first hinge closing direction". The first hinge closing direction adjustment differential screw 172 serves as a "drawing screw" in the first hinge structure.

The first hinge opening direction adjustment differential screw 174 is disposed to penetrate the third plate 133, and the head of the first hinge opening direction adjustment differential screw 174 abuts the first plate 131. The first hinge opening direction adjustment differential screw 174 generates force to deform the first plate 131 and the second plate 132 of the first hinge structure using the first hinge 141 as the turning axis, in a direction of enlarging the space between the first plate 131 and the second plate 132. The direction of enlarging the space between the first plate 131 and the second plate 132 is a direction of opening the first hinge 141. The direction of opening the first hinge 141 is referred to as a "first hinge opening direction". The first hinge opening direction adjustment differential screw 174 serves as a "set screw" in the first hinge structure.

By the combination of the first hinge closing direction adjustment differential screw 172 and the first hinge opening direction adjustment differential screw 174, an angle adjustment in the turning direction, using the first hinge 141 as the turning axis, is performed.

The second hinge closing direction adjustment differential screw 182 is disposed to penetrate the fourth plate 134 and the third plate 133. The second hinge closing direction adjustment differential screw 182 generates force to deform the second plate 132 and the third plate 133 of the second hinge structure using the second hinge 142 as the turning axis, in a direction of drawing the second plate 132 and the third plate 133 close to each other. The direction of drawing the second plate 132 and the third plate 133 close to each other is a direction of closing the second hinge structure. The direction of closing the second hinge structure is referred to as a "second hinge closing direction". The second hinge closing direction adjustment differential screw 182 serves as a "drawing screw" in the second hinge structure.

The second hinge opening direction adjustment differential screw 184 is disposed to penetrate the fourth plate 134, and the head of the second hinge opening direction adjustment differential screw 184 abuts the third plate 133. The second hinge opening direction adjustment differential screw 184 generates force to deform the second plate 132 and the third plate 133 of the second hinge structure using the second hinge 142 as the turning axis, in a direction of enlarging the space between the second plate 132 and the third plate 133. The direction of enlarging the space between the second plate 132 and the third plate 133 is a direction of opening the second hinge structure. The direction of opening the second hinge structure is referred to as a "second hinge opening direction". The second hinge opening direction adjustment differential screw 184 serves as a "set screw" in the second hinge structure.

By the combination of the second hinge closing direction adjustment differential screw 182 and the second hinge opening direction adjustment differential screw 184, an angle adjustment in the turning direction, using the second hinge 142 as the turning axis, is performed.

Figure 15:
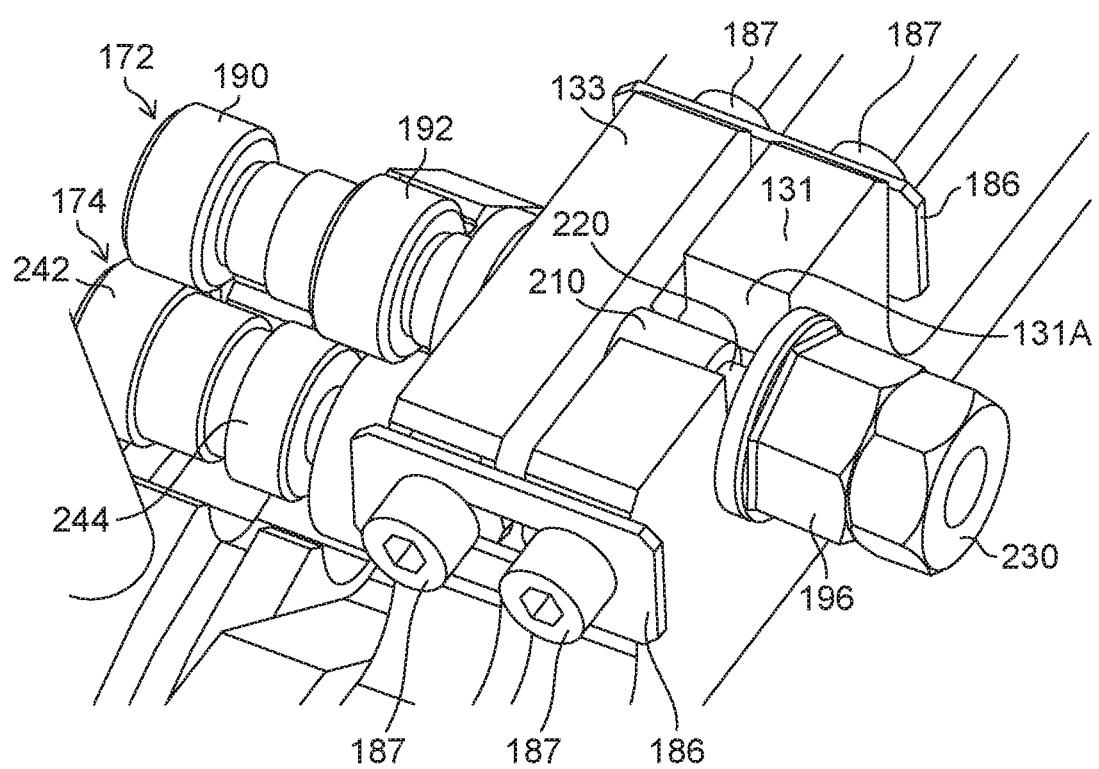
FIG. 15 is an enlarged perspective view of an upper surface portion of an optical element angle adjustment device according to the first embodiment.
Figure 16:
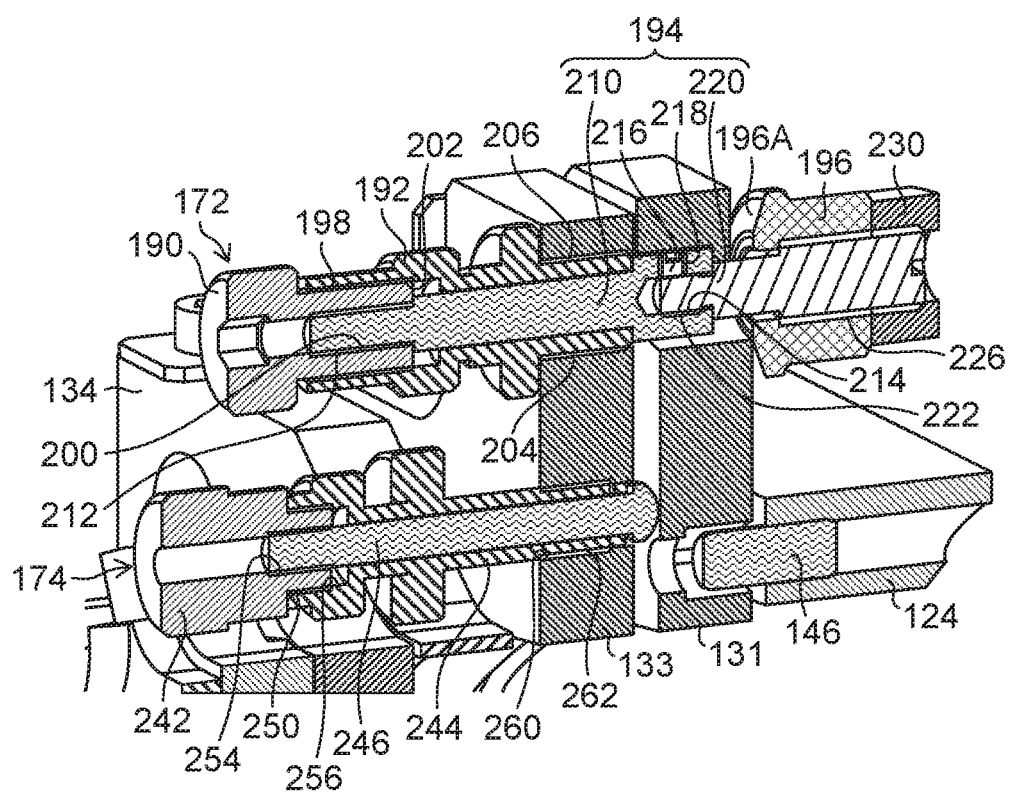
FIG. 16 is a perspective view including a partial cross section illustrating detailed structures of a first hinge closing direction adjustment differential screw and a first hinge opening direction adjustment differential screw.

FIG. 15 is a perspective view of an upper surface portion of the optical element angle adjustment device 120. FIG. 16 is a perspective view including a partial cross section illustrating detailed structures of the first hinge closing direction adjustment differential screw 172 and the first hinge opening direction adjustment differential screw 174.

The first hinge closing direction adjustment differential screw 172 includes a first adjustment knob 190, a first internal thread block 192, a first slide shaft 194, and a spherical nut 196. The shaft part of the first adjustment knob 190 includes an external thread portion 198 constituting an outer thread, and an internal thread portion 200 constituting an inner thread.

The first internal thread block 192 is formed in a cylindrical shape having a hollow structure. The inner wall of the first internal thread block 192 has an internal thread portion 202 of the outer thread that engages with the external thread portion 198 of the first adjustment knob 190. The outer peripheral portion of the first internal thread block 192 has a first mounting external thread portion 206 that engages with a first mounting screw hole 204 formed in the third plate 133.

The first internal thread block 192 is fixed to the third plate 133 such that the first mounting external thread portion 206 is screwed to the first mounting screw hole 204 of the third plate 133.

The first slide shaft 194 may have a structure in which a first slide shaft component 210 and a connecting rod 220 are connected in the axis direction. The first slide shaft component 210 is configured such that turning in a direction about the axis is suppressed by a turn stopping mechanism not illustrated. The first slide shaft component 210 has an external thread portion 212 that engages with an internal thread portion 200 of the first adjustment knob 190. Further, a shaft end portion on a side opposite to the external thread portion 212 of the first slide shaft component 210 has a connecting internal thread portion 214 for connecting the connecting rod 220. Furthermore, the first slide shaft component 210 has a set screw hole 218 to which a set screw 216 to be acted on the connecting internal thread portion 214 is screwed.

The connecting rod 220 has a connecting external thread portion 222. When the connecting external thread portion 222 is screwed to the connecting internal thread portion 214, the first slide shaft component 210 and the connecting rod 220 are integrally connected. Further, when the set screw 216 is inserted to the set screw hole 218 and fastened, the head of the set screw 216 presses the connecting external thread portion 222, whereby loosening of the connecting external thread portion 222 is suppressed.

The first slide shaft 194 is loosely inserted to a notch 131A formed in the first plate 131. The connecting rod 220 has an external thread portion 226 for connecting the spherical nut 196 and a fastening nut 230.

The spherical nut 196 is configured such that a bearing surface that is a side brought into contact with the first plate 131 is a curved surface 196A having a curved surface shape that is part of the spherical face. The fastening nut 230 prevents loosening of the thread by the double nut principle, together with the spherical nut 196.

The first hinge opening direction adjustment differential screw 174 includes a second adjustment knob 242, a second internal thread block 244, and a second slide shaft 246. The shaft part of the second adjustment knob 242 has an external thread portion 250 constituting an outer thread, and an internal thread portion 254 constituting an inner thread.

The second internal thread block 244 is formed in a cylindrical shape having a hollow structure. The inner wall of the second internal thread block 244 has an internal thread portion 256 of an outer thread that engages with an external thread portion 250 of the second adjustment knob 242. The outer peripheral portion of the second internal thread block 244 has a second mounting external thread portion 262 that engages with a second mounting screw hole 260 formed in the third plate 133.

The second internal thread block 244 is fixed to the third plate 133 such that the second mounting external thread portion 262 is screwed to the second mounting screw hole 260 of the of the third plate 133.

A tip portion of the second slide shaft 246 abuts on the first plate 131, and applies press force in a right direction in FIG. 16 to the first plate 131.

Both the first adjustment knob 190 for turning the first hinge closing direction adjustment differential screw 172 and the second adjustment knob 242 for turning the first hinge opening direction adjustment differential screw 174 are disposed on the second plate 132 side that is a front side of the optical element angle adjustment device 120.

The first hinge closing direction adjustment differential screw 172 and the first hinge opening direction adjustment differential screw 174 are arranged to be positioned on a plane perpendicular to the turning axis of the first hinge 141. The first hinge closing direction adjustment differential screw 172 and the first hinge opening direction adjustment differential screw 174 of the present example are arranged to be positioned on a plane perpendicular to the y axis and running through the center of the optical element 150.

The first hinge closing direction adjustment differential screw 172 is disposed at a position farther from the first hinge 141 than the first hinge opening direction adjustment differential screw 174. This means that the distance from the first hinge 141 to the first hinge closing direction adjustment differential screw 172 is longer than the distance from the first hinge 141 to the first hinge opening direction adjustment differential screw 174.

As for the structures of the second hinge closing direction adjustment differential screw 182 and the second hinge opening direction adjustment differential screw 184 for adjusting the angle of the second hinge 142, structures similar to those of the first hinge closing direction adjustment differential screw 172 and the first hinge opening direction adjustment differential screw 174, as illustrated in FIG. 16, are adopted.

An end portion in the axis direction of the second hinge closing direction adjustment differential screw 182 has a spherical nut 266 having a curved surface 266A that abuts on the third plate 133 (see FIG. 6). Further, a fastening nut 270 is used over the spherical nut 266. Thereby, loosening of the thread is suppressed by the double-nut principle.

A relation among the second hinge 142, the second hinge closing direction adjustment differential screw 182, and the second hinge opening direction adjustment differential screw 184 is also the same. Both a third adjustment knob 272 for turning the second hinge closing direction adjustment differential screw 182 and a fourth adjustment knob 274 for turning the second hinge opening direction adjustment differential screw 184 are arranged on the fourth plate 134 side that is a front side of the optical element angle adjustment device 120.

The second hinge closing direction adjustment differential screw 182 and the second hinge opening direction adjustment differential screw 184 are arranged to be positioned on a plane perpendicular to the turning axis of the second hinge 142. The second hinge closing direction adjustment differential screw 182 is disposed at a position farther from the second hinge 142 than the second hinge opening direction adjustment differential screw 184. This means that the distance from the second hinge 142 to the second hinge closing direction adjustment differential screw 182 is longer than the distance from the second hinge 142 to the second hinge opening direction adjustment differential screw 184.

4.2 Operation

For performing angle adjustment, the lock plate 186 is removed or loosened. The first plate 131 is an unmovable plate unmovably fixed to the optical element holder fixing plate 124. Regarding the first hinge 141, the second plate 132 is a movable plate. Through operation of the first hinge closing direction adjustment differential screw 172 and the first hinge opening direction adjustment differential screw 174, the first hinge 141 is deformed, whereby the tilt angle of the second plate 132 is adjusted. Through adjustment of the tilt angle of the second plate 132, the flap angle of the optical element 150 is adjusted.

In the differential screw mechanism adopted in the first hinge closing direction adjustment differential screw 172 and the first hinge opening direction adjustment differential screw 174, a lead difference between the outer thread and the inner thread becomes an advance amount, whereby adjustment can be made in a minute amount. For example, due to a difference caused by a combination of an outer thread of M6, pitch 0.75 and an inner thread of M4, pitch 0.7, the lead becomes 0.05 mm. The expression "M6" represents that the diameter of the screw is 6 mm. The expression "M4" represents that the diameter of the screw is 4 mm.

When the first adjustment knob 190 of the first hinge closing direction adjustment differential screw 172 is turned in the left-turn direction, the first slide shaft 194 moves in a direction of being accommodated in the first internal thread block 192. The left-turn direction is the counterclockwise direction. When the first adjustment knob 190 of the first hinge closing direction adjustment differential screw 172 is turned in the right-turn direction, the first slide shaft 194 moves in a direction of extending from the first internal thread block 192. The right-turn direction is the clockwise direction. According to the turning direction and the turning amount of the first adjustment knob 190, the tilt angle of the second plate 132 can be adjusted.

In the angle adjustment, the curved surface 196A of the spherical nut 196 slides relative to the first plate 131, and angle adjustment is performed while maintaining the contact with the curved surface 196A between the hinge-type adjustment plate 126 and the spherical nut 196.

Figure 17:
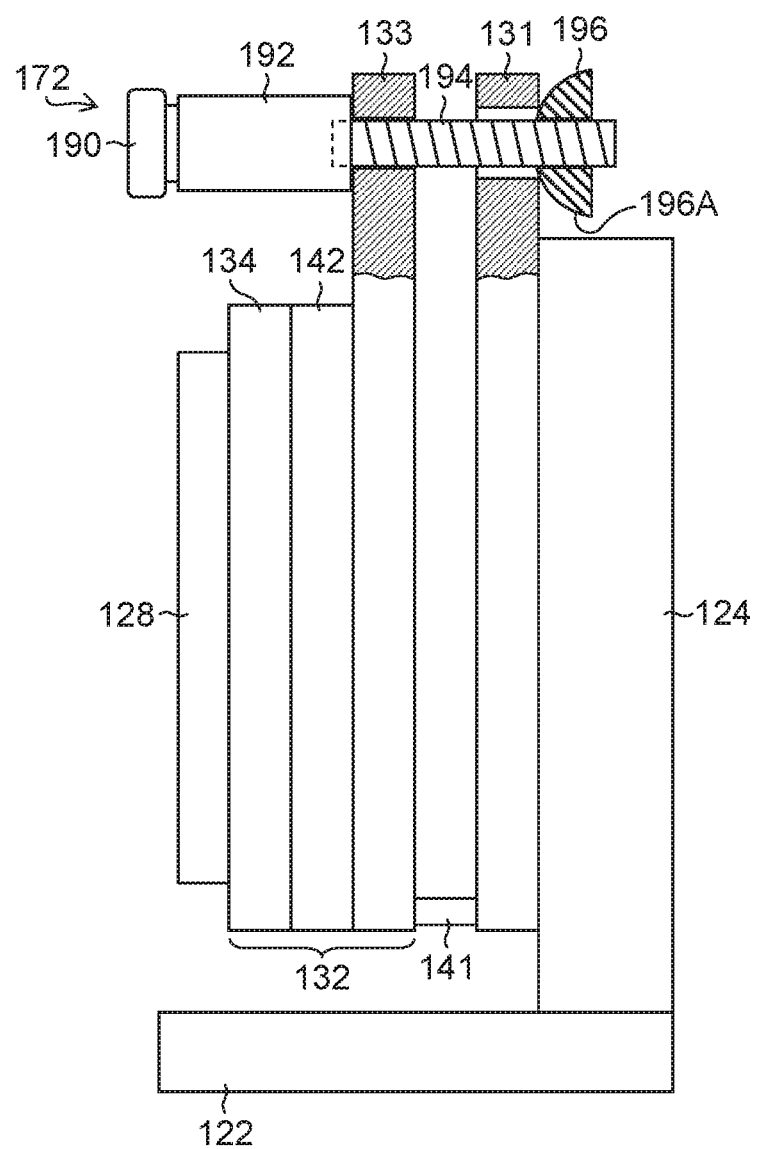
FIG. 17 is a schematic side view including a partial cross section schematically illustrating a configuration of an optical element angle adjustment device according to the first embodiment.
Figure 18:
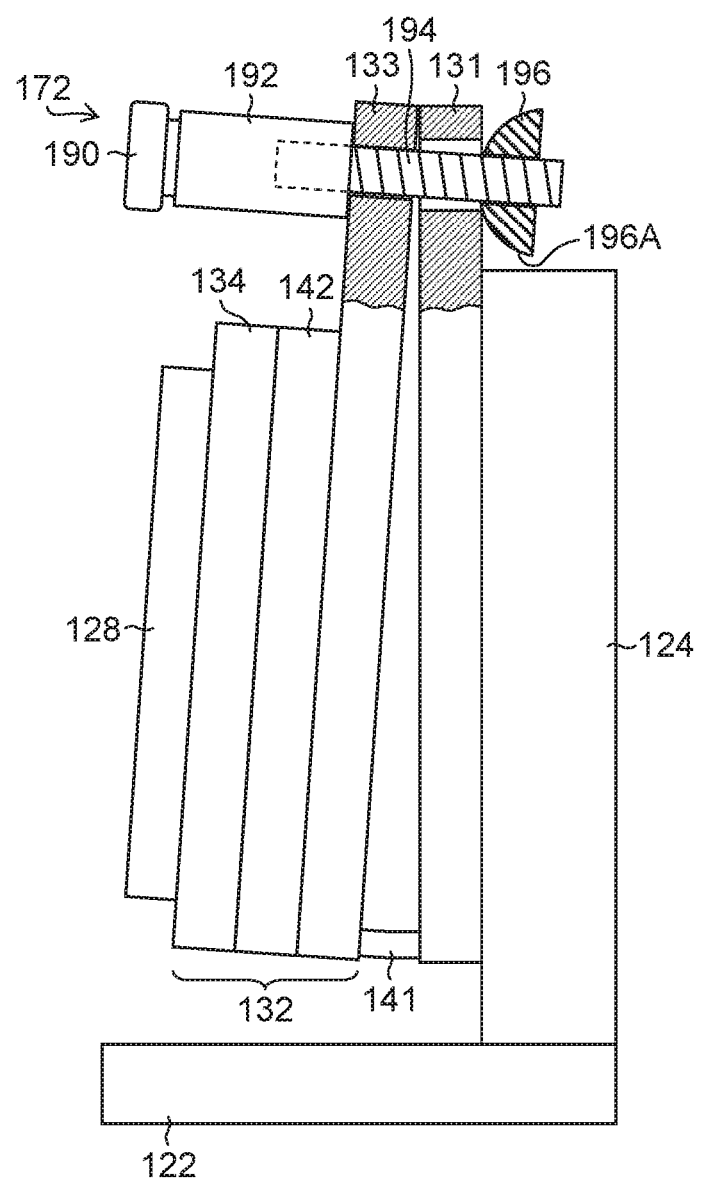
FIG. 18 is a schematic side view including a partial cross section schematically illustrating a state where adjustment is made in a direction of closing a hinge.

FIGS. 17 and 18 are schematic side views each including a partial cross section illustrating a simplified configuration of the optical element angle adjustment device 120 according to the first embodiment. In FIGS. 17 and 18, the first hinge opening direction adjustment differential screw 174 is not illustrated.

FIG. 17 illustrates a state before angle adjustment, and FIG. 18 illustrates a state where the first hinge closing direction adjustment differential screw 172 is turned to be adjusted in a direction of closing the first hinge 141.

When the first hinge closing direction adjustment differential screw 172 is turned and the first slide shaft 194 is drawn to the first internal thread block 192, the first hinge 141 is deformed in a closing direction, and the second plate 132 is tilted using the first hinge 141 as the turning axis.

The first slide shaft 194 of the first hinge closing direction adjustment differential screw 172 fixed to the third plate 133 constituting the second plate 132 is tilted along with movement of the second plate 132. As the first plate 131 is fixed to the optical element holder fixing plate 124, the first slide shaft 194 is tilted at a nonperpendicular angle relative to the first plate 131. The curved surface 196A of the spherical nut 196 provided at an end portion in the axis direction of the first hinge closing direction adjustment differential screw 172 abuts on the first plate 131 slidably.

Even in the case where the first hinge closing direction adjustment differential screw 172 is tilted relative to the first plate 131, as the receiving face by the curved surface 196A follows the deformation of the first hinge 141, excessive force is not applied to the first hinge closing direction adjustment differential screw 172.

Figure 19:
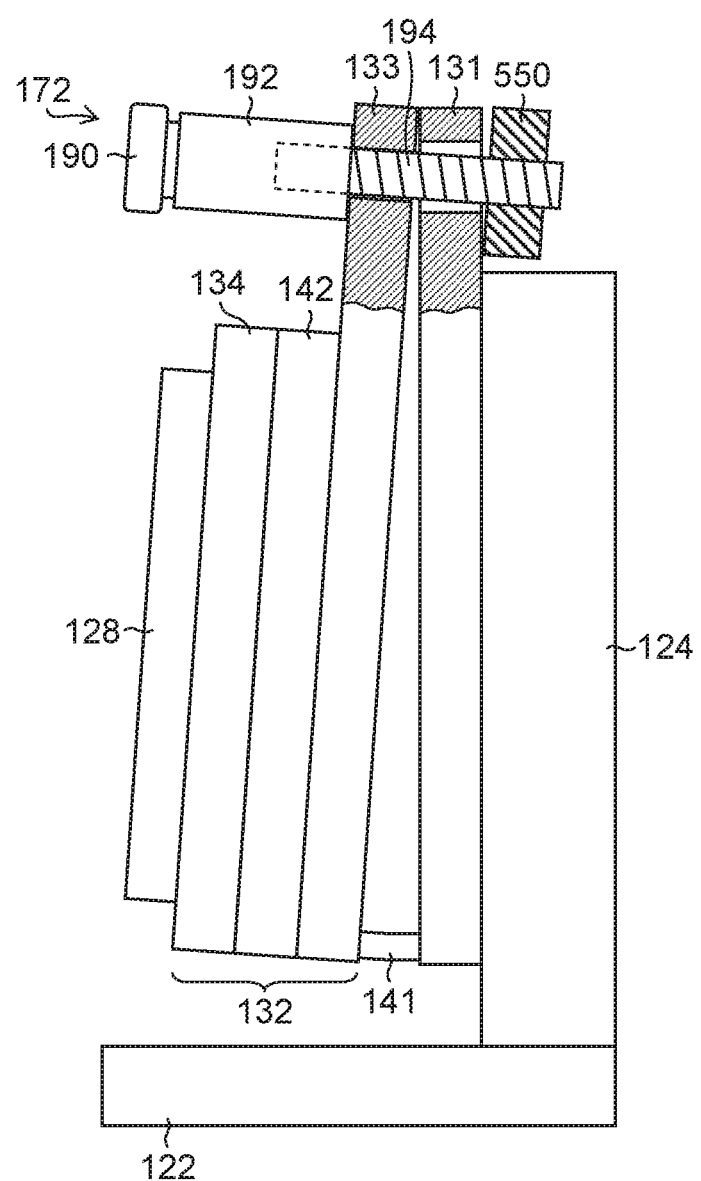
FIG. 19 is a schematic side view including a partial cross section schematically illustrating a state where adjustment is made in a direction of closing a hinge by a structure of a comparative example.

FIG. 19 is a schematic side view illustrating a comparative example of the case of adopting a flat nut 550 having a flat bearing surface, in place of the spherical nut 196 of the first embodiment. In FIG. 19, the same members as those illustrated in FIG. 17 are denoted by the same reference numerals.

In the case of adopting the flat nut 550, when one of the planes of the first plate 131 and the flat nut 550 is tilted, the surfaces cannot be in contact with each other. Whereby, extra force is generated in the screw, which may cause "galling".

As clear from comparison between FIG. 19 and FIG. 18, according to the first embodiment, abutting between the curved surface 196A and the first plate 131 is maintained stably following the tilt angle of the first hinge closing direction adjustment differential screw 172 accompanying the tilt angle of the second plate 132.

In the case of adjusting the first hinge 141 in the opening direction, the first hinge opening direction adjustment differential screw 174 is turned to adjust the tilt angle of the second plate 132.

For angle adjustment using the second hinge 142 as the turning axis, adjustment is performed using the second hinge closing direction adjustment differential screw 182 and the second hinge opening direction adjustment differential screw 184.

An action of the spherical nut 266 of the second hinge closing direction adjustment differential screw 182 is the same as the action of the spherical nut 196 of the first hinge closing direction adjustment differential screw 172.

<Angle Adjustment Operation Procedure>

Here, description will be given on an exemplary procedure of angle adjustment operation for adjusting a flap angle of the optical element 150 with use of the optical element angle adjustment device 120 of the first embodiment. An example of angle adjustment operation is performed in the procedure described below.

[Step 1] Light from an adjustment tool light source is made incident on the optical element 150, and the optical axis position is measured by a sensor. As the adjustment tool light source, a laser light source having a visible light wavelength range such as He—Ne laser can be used.

[Step 2] In order to make the optical axis position match the reference position, one or a plurality of the first hinge closing direction adjustment differential screw 172, the first hinge opening direction adjustment differential screw 174, the second hinge closing direction adjustment differential screw 182, and the second hinge opening direction adjustment differential screw 184 are turned to perform angle adjustment. The flap angle of the optical element 150 is adjusted so as to fall within a range of an allowable deviation amount. Objects to be adjusted are a flap angle in which an axis parallel to the x axis is used as a turning axis and a flap angle in which an axis parallel to the y axis is used as a turning axis. A flap angle may also be referred to as a "tilt angle". The allowable deviation amount of the optical axis position relative to the reference position is 15 microradians [μrad], for example.

In the case of performing adjustment by turning the first hinge closing direction adjustment differential screw 172 in a direction of closing the first hinge 141, the first hinge opening direction adjustment differential screw 174 is loosened so as not to hinder deformation of the first hinge 141.

In the case of performing adjustment by turning the first hinge opening direction adjustment differential screw 174 in a direction of opening the first hinge 141, the spherical nut 196 of the first hinge closing direction adjustment differential screw 172 is loosened so as not to hinder deformation of the first hinge 141.

In the case of performing adjustment by turning the second hinge closing direction adjustment differential screw 182 in a direction of closing the second hinge 142, the second hinge opening direction adjustment differential screw 184 is loosened so as not to hinder deformation of the second hinge 142.

In the case of performing adjustment by turning the second hinge opening direction adjustment differential screw 184 in a direction of opening the second hinge 142, the spherical nut 266 of the second hinge closing direction adjustment differential screw 182 is loosened so as not to hinder deformation of the second hinge 142.

[Step 3] After the angle adjustment at step 2, the lock plate 186 is attached from a side face of the hinge-type adjustment plate 126 with a bolt 187, whereby the deformed state of the first hinge 141 and the second hinge 142 is maintained.

The angle adjustment operation is completed through the procedure from step 1 to step 3 as described above.

The first hinge closing direction adjustment differential screw 172 corresponds to a form of a first adjusting screw. The first hinge opening direction adjustment differential screw 174 corresponds to a form of a second adjusting screw. The first adjustment knob 190 corresponds to a form of a first operation unit. The second adjustment knob 242 corresponds to a form of a second operation unit. The spherical nut 196 corresponds to a form of a first press member. The curved surface 196A of the spherical nut 196 corresponds to a form of a curved surface of an abutting portion of the first press member side. The cooling holder 128 corresponds to a form of an optical element holding part.

The second hinge closing direction adjustment differential screw 182 corresponds to a form of a third adjusting screw. The spherical nut 266 corresponds to a form of a second press member. The curved surface 266A of the spherical nut 266 corresponds to a form of a curved surface of an abutting portion of the second press member side. A portion abutting on the curved surface 266A of the spherical nut 266 in the third plate 133 corresponds to a form of a second hinge side abutting portion. The second hinge opening direction adjustment differential screw 184 corresponds to a form of a fourth adjusting screw.

The lock plate 186 corresponds to a form of a lock member. The first plate 131 may have a long hole to which the first hinge closing direction adjustment differential screw 172 is loosely inserted, in place of the notch 131A to which the first hinge closing direction adjustment differential screw 172 is loosely inserted. Similarly, the third plate 133 may have a long hole to which the second hinge closing direction adjustment differential screw 182 is loosely inserted, in place of the notch 133A (see FIGS. 11 to 14) to which the second hinge closing direction adjustment differential screw 182 is loosely inserted.

4.3 Effect

According to the first embodiment, even in a state where the first hinge 141 is deformed and the first hinge closing direction adjustment differential screw 172 is tilted against the hinge-type adjustment plate 126, extra force is not applied to the first hinge closing direction adjustment differential screw 172, whereby galling can be suppressed. The first adjustment knob 190 and the second adjustment knob 242 are disposed on the same front face side of the optical element angle adjustment device 120. As described above, as both the first adjustment knob 190 and the second adjustment knob 242 are disposed on a face of one side of the hinge-type adjustment plate 126, operation for angle adjustment can be performed easily.

Further, even in a state where the second hinge 142 is deformed and the second hinge closing direction adjustment differential screw 182 is tilted against the hinge-type adjustment plate 126, extra force is not applied to the second hinge closing direction adjustment differential screw 182, whereby galling can be suppressed. The third adjustment knob 272 and the fourth adjustment knob 274 are disposed on the same front face side of the optical element angle adjustment device 120. Accordingly, operation for angle adjustment can be performed easily.

5. Second Embodiment 5.1 Configuration

Figure 20:
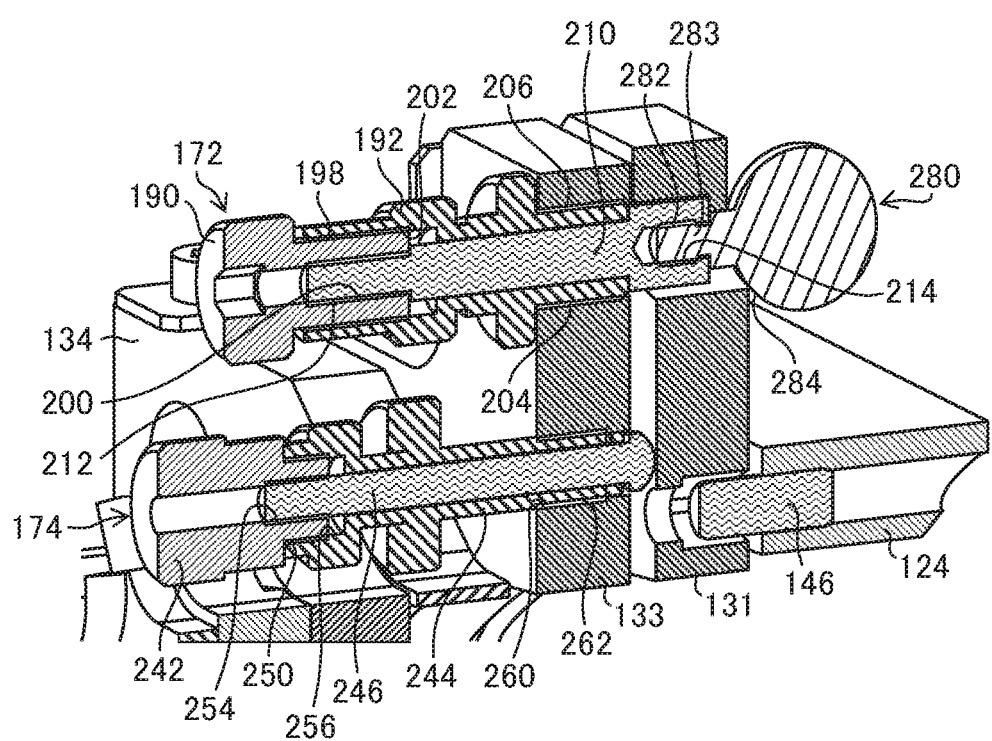
FIG. 20 is a perspective view including a partial cross section of an optical element angle adjustment device according to a second embodiment.

FIG. 20 is a perspective view including a partial cross section illustrating a configuration of an optical element angle adjustment device according to a second embodiment. In FIG. 20, the same elements as those of the first embodiment illustrated in FIGS. 4 to 16 are denoted by the same reference numerals. Description will be given on the difference from the first embodiment. Description on common parts is omitted. The second embodiment includes a spherical member 280, in place of the connecting rod 220, the spherical nut 196, and the fastening nut 230 of the first embodiment.

The spherical member 280 includes a connecting external thread portion 282 to be screwed to the internal thread portion 214 of the first slide shaft 194, and a curved surface 284 that abuts on the first plate 131 slidably. The spherical member 280 is a member in which a connecting shaft 283 having the connecting external thread portion 282 and a spherical body constituting the curved surface 284 are integrally formed. The curved surface 284 has a curved surface shape constituting part of the spherical surface.

An end portion of the second hinge closing direction adjustment differential screw 182 may adopt a configuration including a spherical member similar to the spherical member 280 illustrated in FIG. 20, although such a configuration is not illustrated. The other configurations are the same as those of the first embodiment.

5.2 Operation

The curved surface 284 of the spherical member 280 abuts on the first plate 131, and the abutting state on the first plate 131 is maintained with movement of the contact point with the first plate 131, following the tilt of the first hinge closing direction adjustment differential screw 172 along with opening and closing of the first hinge 141.

In this way, for angle adjustment, an angle is adjusted while maintaining the abutting state between the hinge-type adjustment plate 126 and the spherical member 280.

5.3 Effect

In the second embodiment, in addition to an effect that galling can be suppressed similar to case of the first embodiment, the spherical member 280 has a simpler structure than that of the spherical nut 196, whereby component production is easier. According to the second embodiment, an effect similar to that of the first embodiment can be achieved with use of a component that can be produced easily.

6. Third Embodiment 6.1 Configuration

Figure 21:
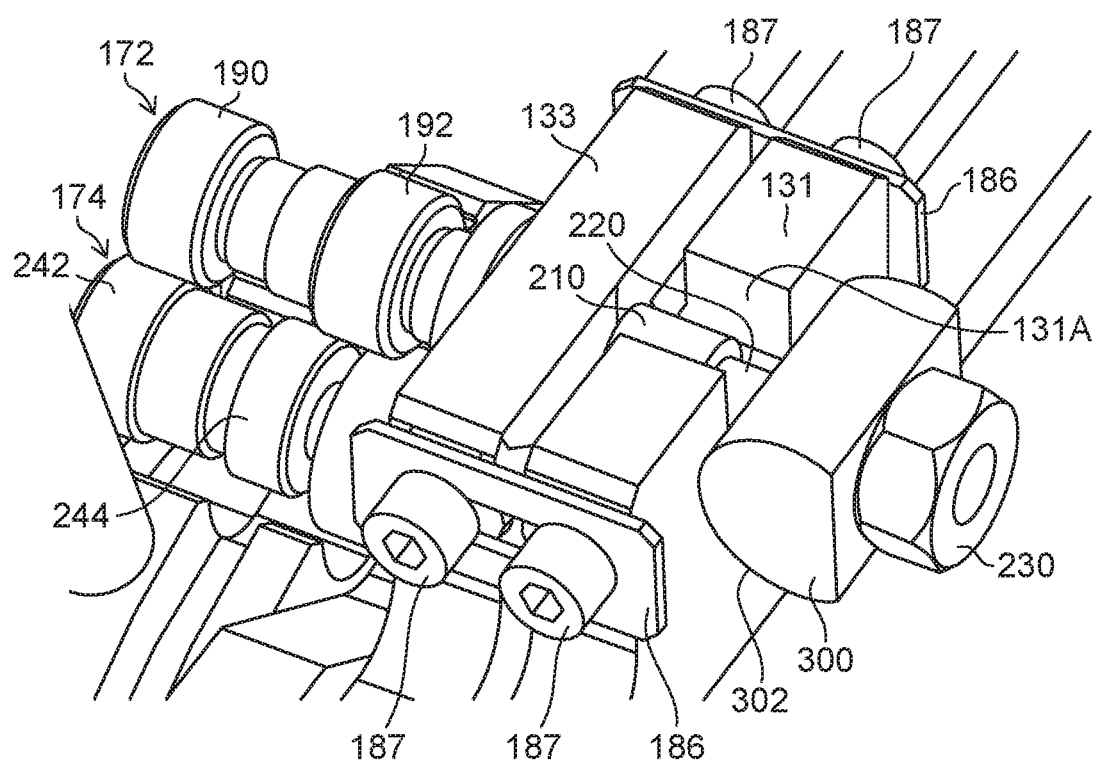
FIG. 21 is a perspective view of an upper surface portion of an optical element angle adjustment device according to a third embodiment.
Figure 22:
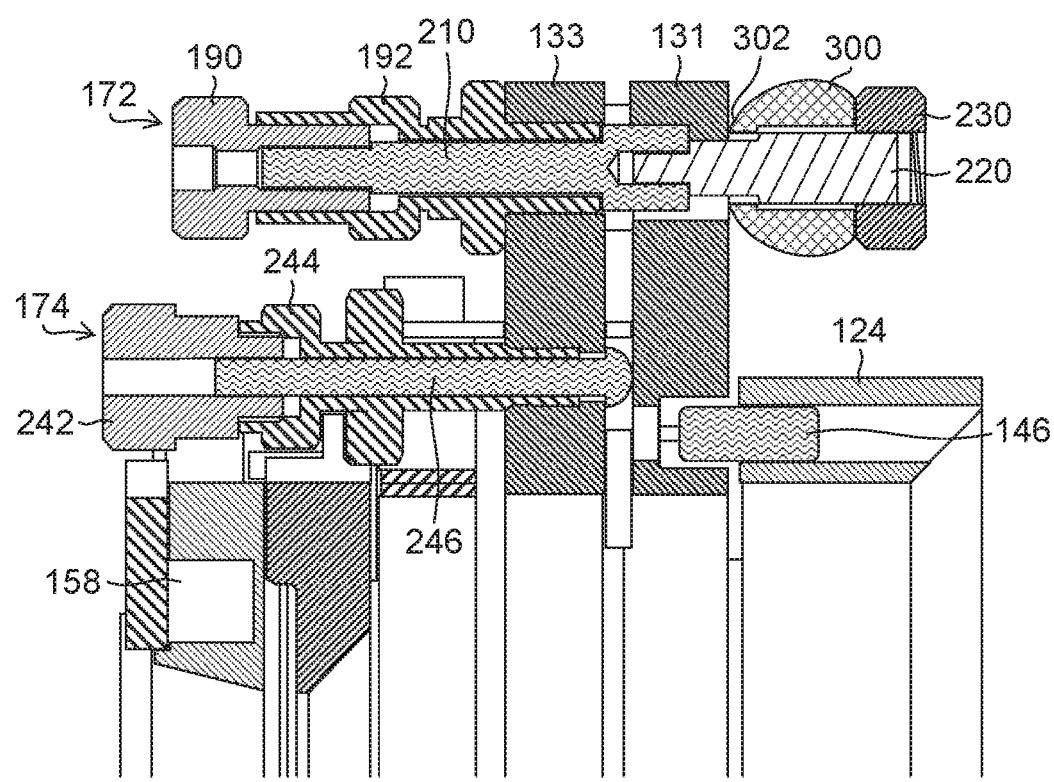
FIG. 22 is a cross-sectional view illustrating part of an optical element angle adjustment device according to the third embodiment.

FIG. 21 is a perspective view of an upper surface portion of an optical element angle adjustment device according to a third embodiment. FIG. 22 is a cross-sectional view of part of the optical element angle adjustment device according to the third embodiment. In FIGS. 21 and 22, the same elements as those of the first embodiment illustrated in FIGS. 4 to 16 are denoted by the same reference numerals. Description will be given on the difference from the first embodiment. Description on common parts is omitted.

In the third embodiment, a cylindrical nut 300 is used in place of the spherical nut 196 of the first embodiment. The cylindrical nut 300 has a curved surface 302 having a cylindrical face shape that is part of the cylindrical face. The curved surface 302 is a convex surface protruding toward the first plate 131. The cylindrical nut 300 is disposed such that the axis of the cylindrical surface of the cylindrical nut 300 is parallel with the turning axis of the first hinge 141. This means that the cylindrical nut 300 is disposed such that the axis of the cylindrical surface is provided toward the x axis direction.

The radius of curvature of the curved surface 302 of the cylindrical nut 300 can be designed to have an appropriate value. As an example, the radius of curvature of the curved surface 302 of the cylindrical nut 300 may be 15 millimeters [mm].

The second hinge closing direction adjustment differential screw 182 may also adopt a cylindrical nut similar to the cylindrical nut 300 illustrated in FIG. 21 in place of the spherical nut 266, although such a cylindrical nut is not illustrated. The cylindrical nut is disposed such that the axis of the cylindrical nut provided to an end portion of the second hinge closing direction adjustment differential screw 182 is parallel with the turning axis of the second hinge 142. The other configurations are the same as those of the first embodiment.

6.2 Operation

The curved surface 302 of the cylindrical nut 300 abuts on the first plate 131, and the abutting state on the first plate 131 is maintained with movement of the contact point with the first plate 131, following the tilt of the first hinge closing direction adjustment differential screw 172 along with opening and closing of the first hinge 141.

In this way, for angle adjustment, an angle is adjusted while maintaining the abutting state between the hinge-type adjustment plate 126 and the cylindrical nut 300.

6.3 Effect

In the third embodiment, in addition to an effect that galling can be suppressed similar to the case of the first embodiment, the cylindrical nut can be produced easily compared with the case of a spherical nut. According to the third embodiment, an effect similar to that of the first embodiment can be achieved with use of a component that can be produced easily.

7. Fourth Embodiment 7.1 Configuration

Figure 23:
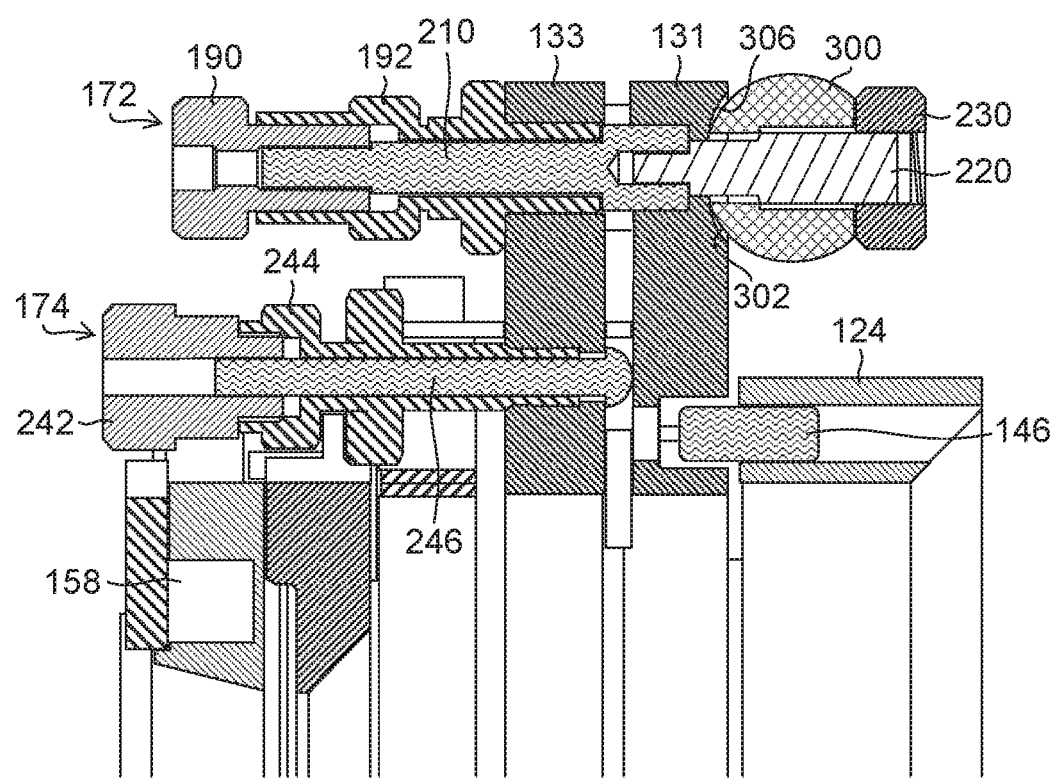
FIG. 23 is a cross-sectional view illustrating part of an optical element angle adjustment device according to a fourth embodiment.
Figure 24:
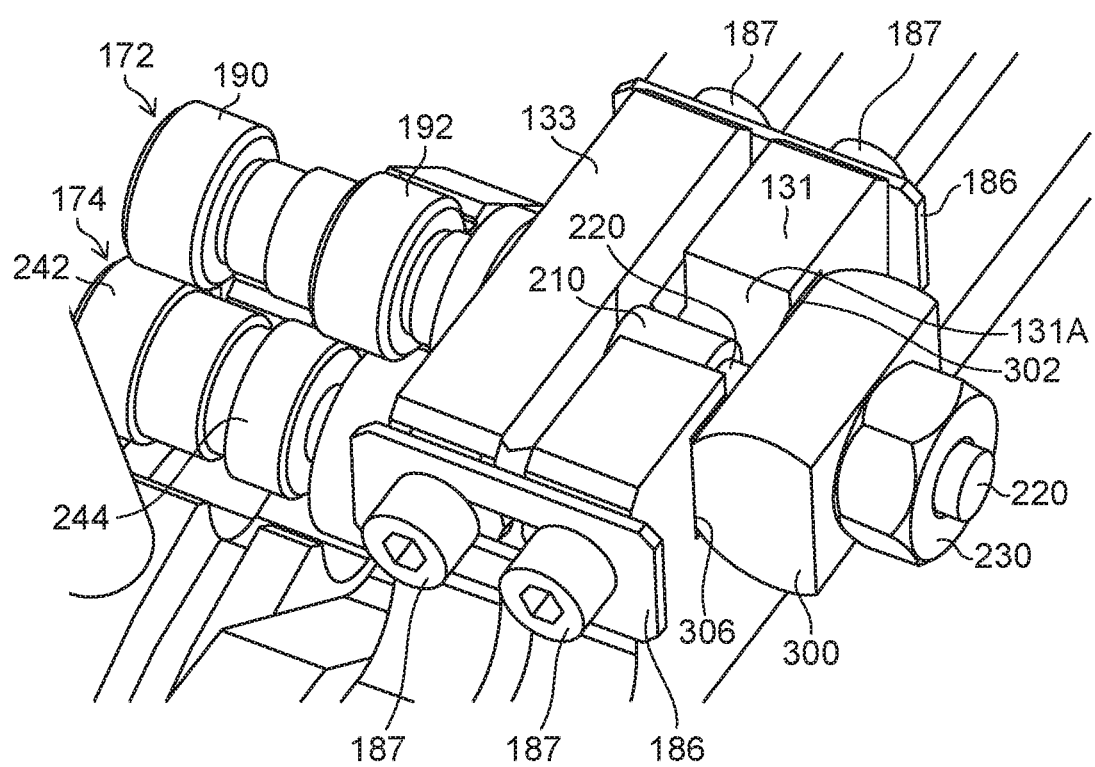
FIG. 24 is a perspective view of an upper surface portion of the optical element angle adjustment device according to the fourth embodiment.

FIG. 23 is a cross-sectional view of part of an optical element angle adjustment device according to a fourth embodiment. FIG. 24 is a perspective view of an upper surface portion of the optical element angle adjustment device according to the fourth embodiment. In FIGS. 23 and 24, the same elements as those of the third embodiment illustrated in FIGS. 21 and 22 are denoted by the same reference numerals. Description will be given on the difference from the third embodiment. Description on common parts is omitted. In the fourth embodiment, cylindrical processing is performed on an abutting portion on the first plate 131 side on which the curved surface 302 of the cylindrical nut 300 abuts. This means that the first plate 131 includes a first hinge side curved surface 306 having a cylindrical face shape that is part of the cylindrical surface, at a portion on which the cylindrical nut 300 abuts. The first hinge side curved surface 306 is a concave surface that is recessed with respect to the cylindrical nut 300. It is preferable that the radius of curvature of the first hinge side curved surface 306 is larger than the radius of curvature of the curved surface 302 of the cylindrical nut 300. As an example, when the radius of curvature of the curved surface 302 of the cylindrical nut 300 is 15 millimeters [mm], the radius of curvature of the first hinge side curved surface 306 can be 18 millimeters [mm].

Although not illustrated, cylindrical processing is performed on an abutting portion of the third plate 133 on which the cylindrical nut of the second hinge closing direction adjustment differential screw 182 abuts. This means that the third plate 133 includes a second hinge side curved surface having a cylindrical face shape that is part of the cylindrical surface, at a portion on which the cylindrical nut of the second hinge closing direction adjustment differential screw 182 abuts. The other configurations are the same as those of the third embodiment.

7.2 Operation

The first hinge side curved surface 306 of the first plate 131 functions as a receiving part that receives the cylindrical nut 300. The curved surface 302 of the cylindrical nut 300 abuts on the first hinge side curved surface 306 of the first plate 131, and the abutting state on the first plate 131 is maintained with movement of the contact point with the first plate 131, following the tilt of the first hinge closing direction adjustment differential screw 172 along with opening and closing of the first hinge 141.

The curved surface 302 of the cylindrical nut 300 corresponds to a form of a first press member side curved surface.

7.3 Effect

In the fourth embodiment, in addition to the fact that an effect similar to that of the third embodiment can be achieved, contact area between the cylindrical nut 300 and the first plate 131 is increased compared with the case of the third embodiment, whereby the stress can be reduced. Moreover, contact area between the cylindrical nut of the second hinge closing direction adjustment differential screw 182 and the third plate 133 is increased, whereby the stress can be reduced.

8. Fifth Embodiment 8.1 Configuration

Figure 25:
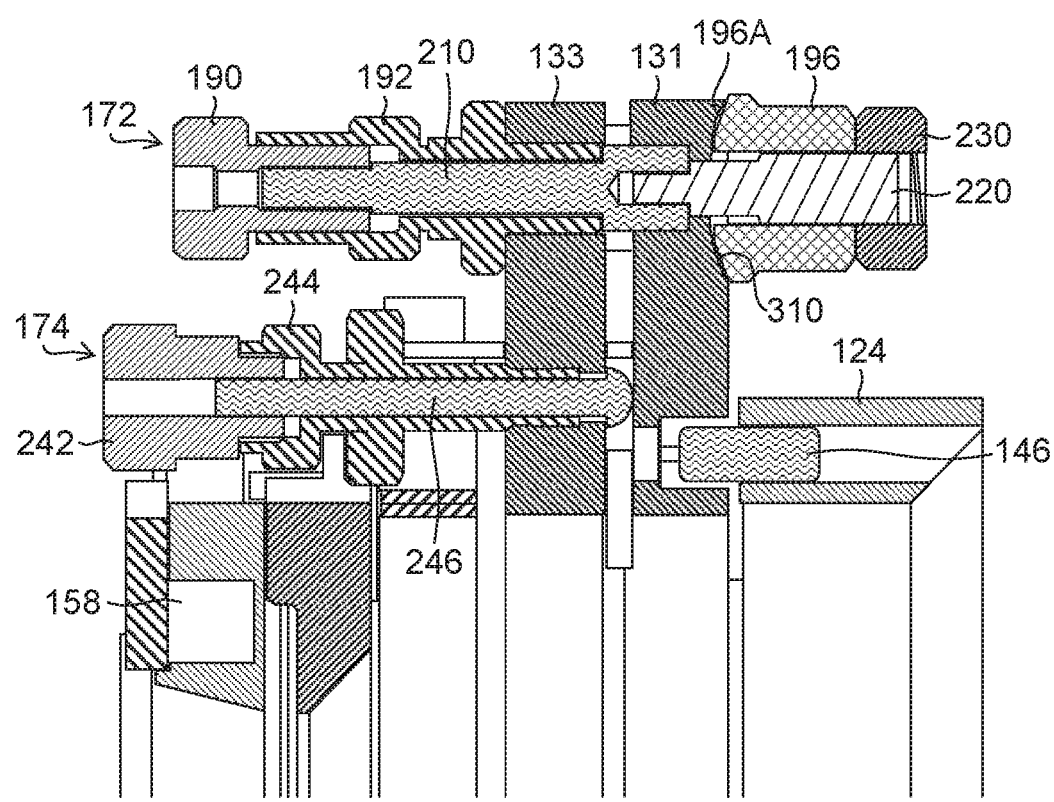
FIG. 25 is a cross-sectional view illustrating part of an optical element angle adjustment device according to a fifth embodiment.

FIG. 25 is a cross-sectional view of part of an optical element angle adjustment device according to a fifth embodiment. In FIG. 25, the same elements as those of the first embodiment illustrated in FIGS. 4 to 16 are denoted by the same reference numerals. Description will be given on the difference from the first embodiment. Description on common parts is omitted. In the fifth embodiment, spherical processing is performed on an abutting portion of the first plate 131 on which the curved surface 196A of the spherical nut 196 abuts. This means that the first plate 131 includes a first hinge side curved surface 310 having a spherical face shape that is part of the spherical surface, at a portion on which the spherical nut 196 abuts. The first hinge side curved surface 310 is a concave surface that is recessed with respect to the spherical nut 196. It is preferable that the radius of curvature of the first hinge side curved surface 310 is larger than the radius of curvature of the curved surface 196A of the spherical nut 196. As an example, when the radius of curvature of the curved surface 196A of the spherical nut 196 is 15 millimeters [mm], the radius of curvature of the first hinge side curved surface 310 can be 18 millimeters [mm].

Although not illustrated, similar spherical processing is also performed on an abutting portion of the third plate 133 on which the spherical nut 266 of the second hinge closing direction adjustment differential screw 182 abuts. This means that the third plate 133 includes a second hinge side curved surface having a recessed spherical shape that is part of the spherical surface, at a portion on which the spherical nut 266 of the second hinge closing direction adjustment differential screw 182 abuts. The other configurations are the same as those of the first embodiment.

8.2 Operation

The first hinge side curved surface 310 of the first plate 131 functions as a receiving part that receives the spherical nut 196. The curved surface 196A of the spherical nut 196 abuts on the first hinge side curved surface 310 of the first plate 131, and the abutting state on the first plate 131 is maintained with movement of the contact point with the first plate 131, following the tilt of the first hinge closing direction adjustment differential screw 172 along with opening and closing of the first hinge 141.

8.3 Effect

In the fifth embodiment, in addition to the fact that an effect similar to that of the first embodiment can be achieved, contact area between the spherical nut 196 and the first plate 131 is increased compared with the case of the first embodiment, whereby the stress can be reduced. Similarly, contact area between the spherical nut 266 and the third plate 133 is increased, whereby the stress can be reduced.

9. Sixth Embodiment 9.1 Configuration

Figure 26:
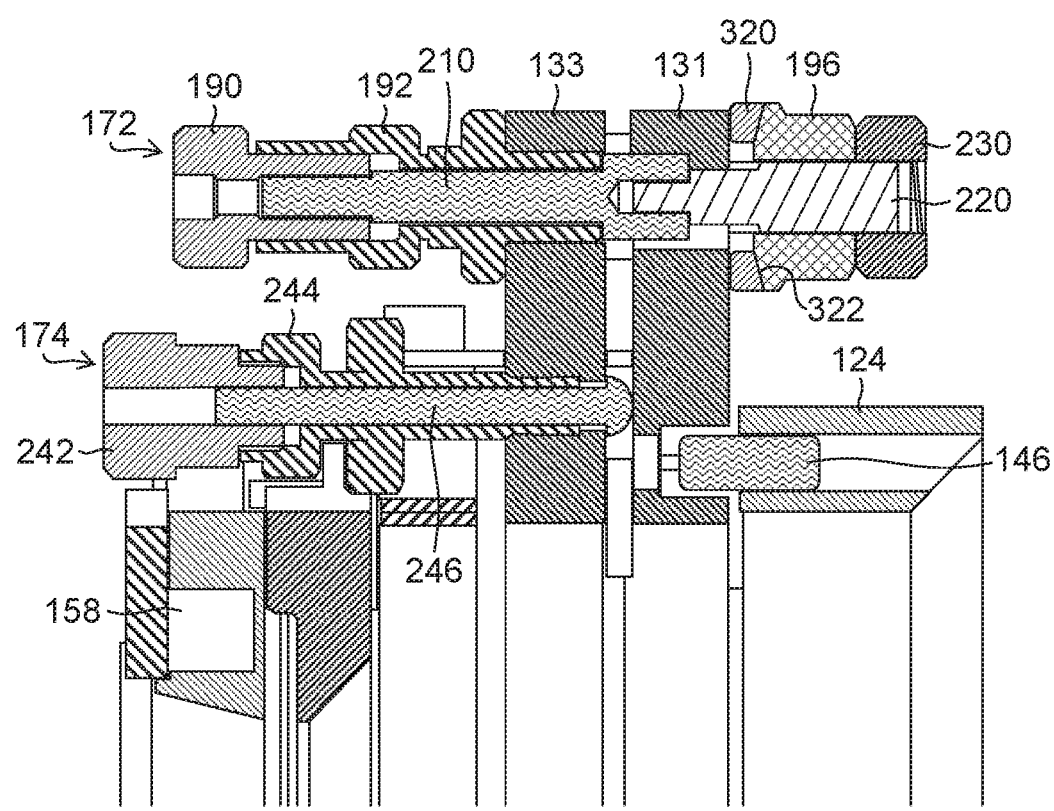
FIG. 26 is a cross-sectional view illustrating part of an optical element angle adjustment device according to a sixth embodiment.
Figure 27:
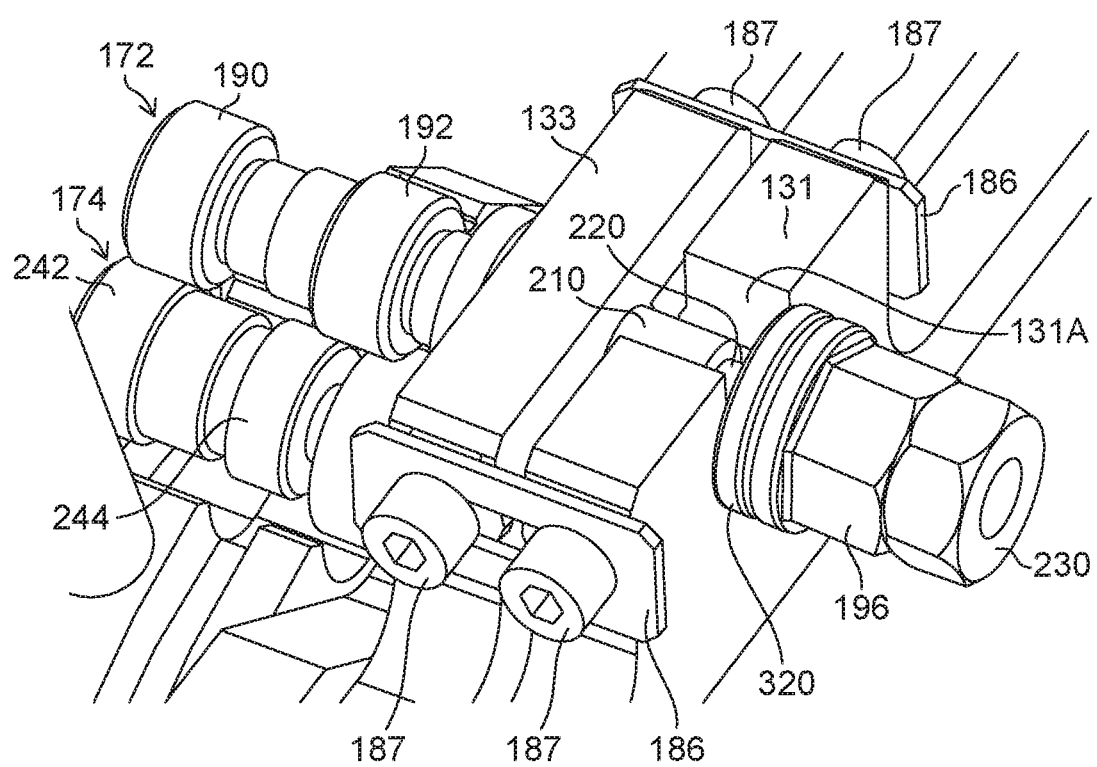
FIG. 27 is a perspective view of an upper surface portion of the optical element angle adjustment device according to the sixth embodiment.

FIG. 26 is a cross-sectional view of part of an optical element angle adjustment device according to a sixth embodiment. FIG. 27 is a perspective view of an upper surface portion of the optical element angle adjustment device according to the sixth embodiment. In FIGS. 26 and 27, the same elements as those of the first embodiment illustrated in FIGS. 4 to 16 are denoted by the same reference numerals. Description will be given on the difference from the first embodiment. Description on common parts is omitted.

In the sixth embodiment, a spherical washer 320 is used in an abutting portion of the first plate 131 on which the curved surface 196A of the spherical nut 196 abuts. The spherical washer 320 includes a curved surface 322 having a spherical face shape that is part of the spherical surface, on a surface of the side on which the spherical nut 196 abuts. The curved surface 322 of the spherical washer 320 is a concave surface that is recessed with respect to the spherical nut 196. It is preferable that the radius of curvature of the curved surface 322 of the spherical washer 320 is larger than the radius of curvature of the curved surface 196A of the spherical nut 196. As an example, when the radius of curvature of the curved surface 196A of the spherical nut 196 is 15 millimeters [mm], the radius of curvature of the curved surface 322 of the spherical washer 320 can be 18 millimeters [mm].

Although not illustrated, a spherical washer is also used in an abutting portion of the third plate 133 on which the spherical nut 266 of the second hinge closing direction adjustment differential screw 182 abuts. The other configurations are the same as those of the first embodiment.

9.2 Operation

The curved surface 196A of the spherical nut 196 abuts on the curved surface 322 of the spherical washer 320. The spherical nut 196 maintains the abutting state on the first plate 131 with movement of the contact point with the first plate 131, following the tilt of the first hinge closing direction adjustment differential screw 172 along with opening and closing of the first hinge 141. The curved surface 322 of the spherical washer 320 serves as a first hinge side abutting portion.

9.3 Effect

In the sixth embodiment, in addition to the fact that an effect similar to that of the first embodiment can be achieved, contact area between the spherical nut 196 and the spherical washer 320 is increased compared with the case of the first embodiment, whereby the stress can be reduced. Further, the area of the bearing surface can be increased by the spherical washer 320, whereby the stress can be further reduced.

10. Seventh Embodiment 10.1 Configuration

Figure 28:
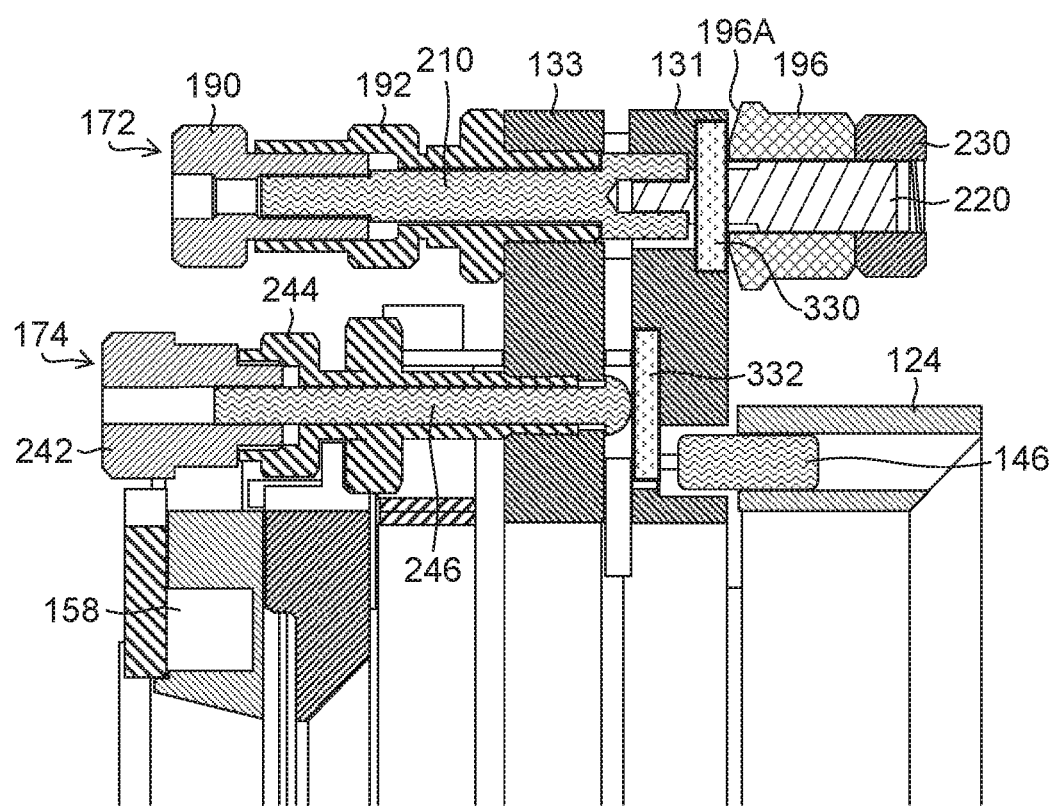
FIG. 28 is a schematic side view including a partial cross section schematically illustrating a configuration of an optical element angle adjustment device according to a seventh embodiment.

FIG. 28 is a cross-sectional view of part of an optical element angle adjustment device according to a seventh embodiment. In FIG. 27, the same elements as those of the first embodiment illustrated in FIGS. 4 to 16 are denoted by the same reference numerals. Description will be given on the difference from the first embodiment. Description on common parts is omitted.

In the seventh embodiment, as a material of the spherical nut 196, a material having a high hardness such as SUS440C or SKS3 is used. SUS440C is martensitic stainless steel. SKS3 is alloy tool steel.

As extra super duralumin such as A7075 is used for the hinge-type adjustment plate 126 to enhance the durability, it is likely to be deformed. Accordingly, to the nut abutting portion 330, that is an abutting portion of the hinge-type adjustment plate 126 on the spherical nut 196, a plate made of a material having a high hardness such as SUS440C or SKS3 is also inserted. It is preferable that the material of the spherical nut 196 and the material of the nut abutting portion 330 are the same.

Further, to the adjustment differential screw head abutting portion 332 that is an abutting portion of the hinge-type adjustment plate 126 on which the head of the first hinge opening direction adjustment differential screw 174 abuts, a plate made of a material having a high hardness such as SUS404C or SKS3 is also inserted.

Although not illustrated, a plate made of a material having a high hardness such as SUS440C or SKS3 is also inserted to the nut abutting portion that is an abutting portion of the third plate 133 side on which the spherical nut 266 of the second hinge closing direction adjustment differential screw 182 abuts. Further, to the adjustment differential screw head abutting portion 332 that is an abutting portion of the hinge-type adjustment plate 126 on which the head of the second hinge opening direction adjustment differential screw 184 abuts, a plate made of a material having a high hardness such as SUS404C or SKS3 is also inserted. The other configurations are the same as those of the first embodiment.

10.2 Operation

Operation of angle adjustment in the seventh embodiment is similar to that of the first embodiment.

10.3 Effect

According to the seventh embodiment, in the hinge-type adjustment plate 126, deformation due to stress concentration of an abutting portion that is a point contact portion and/or a line contact portion with a differential screw for angle adjustment can be suppressed. A differential screw for angle adjustment indicates any of the first hinge closing direction adjustment differential screw 172, the first hinge opening direction adjustment differential screw 174, the second hinge closing direction adjustment differential screw 182, and the second hinge opening direction adjustment differential screw 184.

The material of a plate to be inserted to each of the nut abutting portion 330 and the adjustment differential screw head abutting portion 332 corresponds to a "first material". SUS440C or SKS3 is an example of the first material. A portion made of a material of A7050 in the hinge-type adjustment plate 126 corresponds to a "non-abutting portion". A7075 is an example of a second material.

11. Eighth Embodiment 11.1 Configuration

Figure 29:
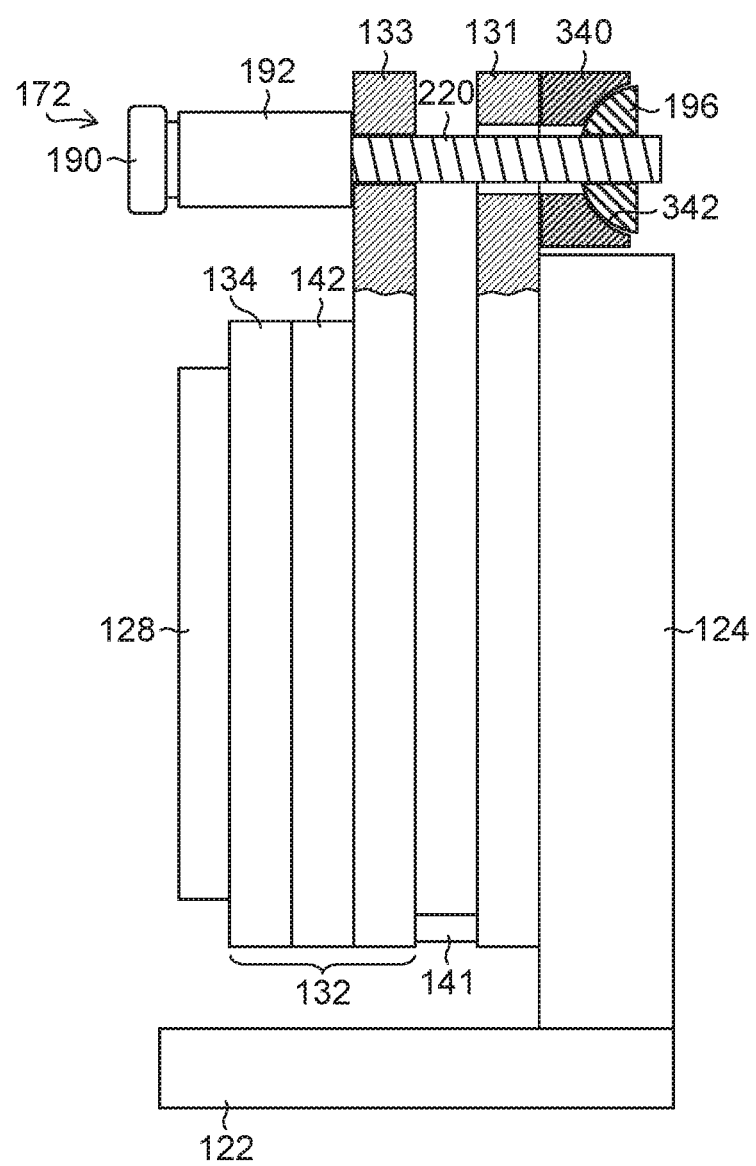
FIG. 29 is a schematic side view including a partial cross section schematically illustrating a configuration of an optical element angle adjustment device according to an eighth embodiment.

FIG. 29 is a schematic side view schematically illustrating a configuration of an optical element angle adjustment device according to an eighth embodiment. In FIG. 29, the same elements as those of the first embodiment illustrated in FIGS. 4 to 16 are denoted by the same reference numerals. Description will be given on the difference from the first embodiment. Description on common parts is omitted.

In the eighth embodiment, an abutting portion of the first plate 131 on the spherical nut 196 includes a curved surface receiving part 340 serving as a receiving part for the spherical nut 196.

The curved surface receiving part 340 includes a curved surface 342 for receiving the curved surface 196A of the spherical nut 196. The curved surface 342 of the curved surface receiving part 340 is a concave surface that is recessed with respect to the spherical nut 196.

The material of the spherical nut 196 is SUS440C, SKS3, or the like. It is preferable that SUS440C, SKS3, or the like is used as the material of the curved surface receiving part 340, like the material of the spherical nut 196.

The curved surface 342 of the curved surface receiving part 340 may be in a spherical shape that is part of the spherical surface, for example. It is preferable that the radius of curvature of the curved surface 342 is larger than the radius of curvature of the curved surface 196A of the spherical nut 196. The curved surface receiving part 340 can be connected with the hinge-type adjustment plate 126 through press fitting or bolt fastening.

An abutting portion of the third plate 133 side, on which the spherical nut 266 of the second hinge closing direction adjustment differential screw 182 abuts, is also provided with a curved surface receiving part having a concave surface serving as a receiving part for the spherical nut 266, although such a curved surface receiving part is not illustrated. It is preferable that SUS440C, SKS3, or the like is used as the material of the curved surface receiving part serving as a receiving part for the spherical nut 266, like the material of the spherical nut 266. The other configurations are the same as those of the first embodiment.

11.2 Operation

Operation of angle adjustment in the eighth embodiment is similar to that of the first embodiment.

11.3 Effect

According to the eighth embodiment, in the hinge-type adjustment plate 126, deformation due to stress concentration on an abutting portion that is a point contact portion and/or a line contact portion with a differential screw for angle adjustment is suppressed.

12. Ninth Embodiment 12.1 Configuration

Figure 30:
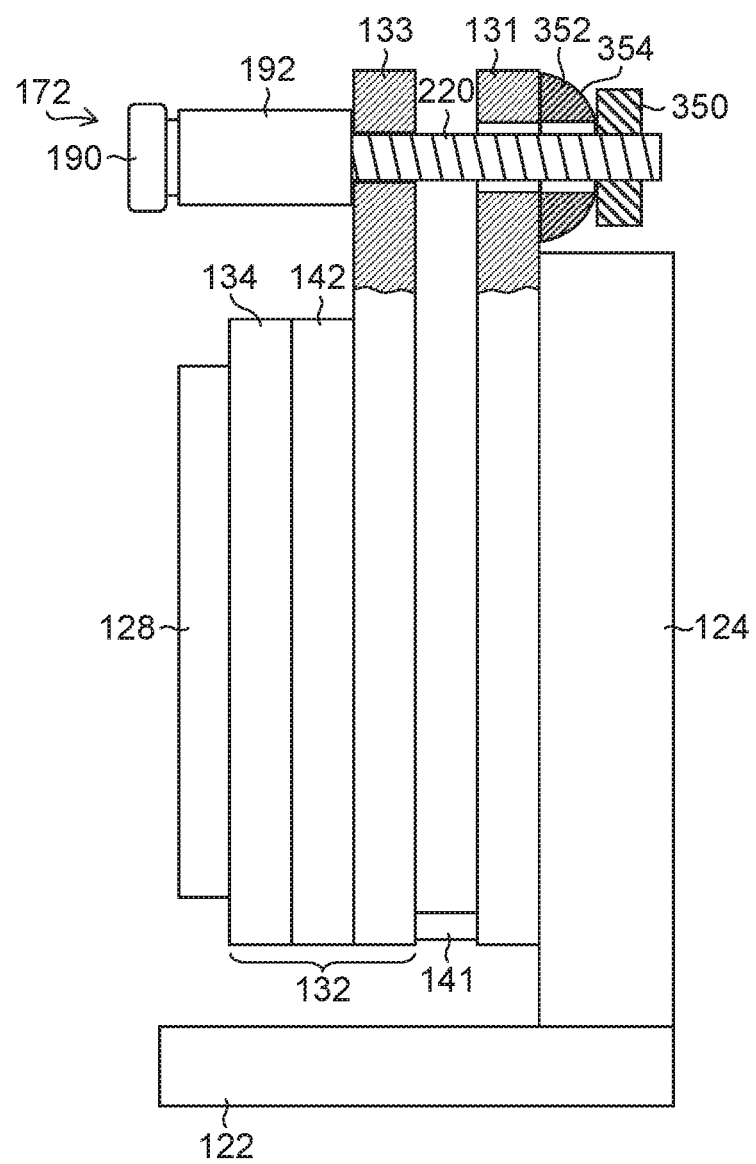
FIG. 30 is a schematic side view including a partial cross section schematically illustrating a configuration of an optical element angle adjustment device according to a ninth embodiment.

FIG. 30 is a schematic side view schematically illustrating a configuration of an optical element angle adjustment device according to a ninth embodiment. In FIG. 30, the same elements as those of the eighth embodiment illustrated in FIG. 29 are denoted by the same reference numerals. Description will be given on the difference from the eighth embodiment. Description on common parts is omitted.

In the ninth embodiment, a flat nut 350 in which an abutting side face is flat is used in place of the spherical nut 196 as a press member. Further, the first plate 131 includes a curved surface receiving part 352 serving as a receiving part for the flat nut 350.

The curved surface receiving part 352 includes a curved surface 354 that abuts on the flat nut 350. The curved surface 354 of the curved surface receiving part 340 is a convex surface protruding with respect to the flat nut 350. The material of the flat nut 350 is SUS440C, SKS3, or the like. It is preferable that SUS440C, SKS3, or the like is used as a material of the curved surface receiving part 352, like the material of the flat nut 350.

The curved surface 354 of the curved surface receiving part 352 may be in a spherical surface shape that is part of the spherical surface, for example. The radius of curvature of the curved surface 354 is designed to be 15 millimeters [mm], for example. Alternatively, the curved surface 354 may be in a cylindrical surface shape that is part of the cylindrical surface. The curved surface receiving part 352 can be connected with the hinge-type adjustment plate 126 through press fitting or bolt fastening.

An abutting portion of the third plate 133 side, on which the flat nut provided at an end portion in the axis direction of the second hinge closing direction adjustment differential screw 182 abuts, is also provided with a curved surface receiving part serving as a receiving part for the flat nut, although such a curved surface receiving part is not illustrated. It is preferable that SUS440C, SKS3, or the like is used as a material of the curved surface receiving part serving as a receiving part for the flat nut, like the material of the flat nut 350. The other configurations are the same as those of the eighth embodiment.

12.2 Operation

In the ninth embodiment, the bearing surface of the flat nut 350 abuts on the curved surface 354 that is a convex surface. For angle adjustment, the bearing surface of the flat nut 350 maintains abutting, with movement of the contact point with the curved surface 354 of the curved surface receiving part 352. Operation of angle adjustment in the ninth embodiment is similar to that of the first embodiment.

12.3 Effect

According to the ninth embodiment, in the hinge-type adjustment plate 126, deformation due to stress concentration on an abutting portion that is a point contact portion and/or a line contact portion with a differential screw for angle adjustment is suppressed.

13. Tenth Embodiment 13.1 Configuration

Figure 31:
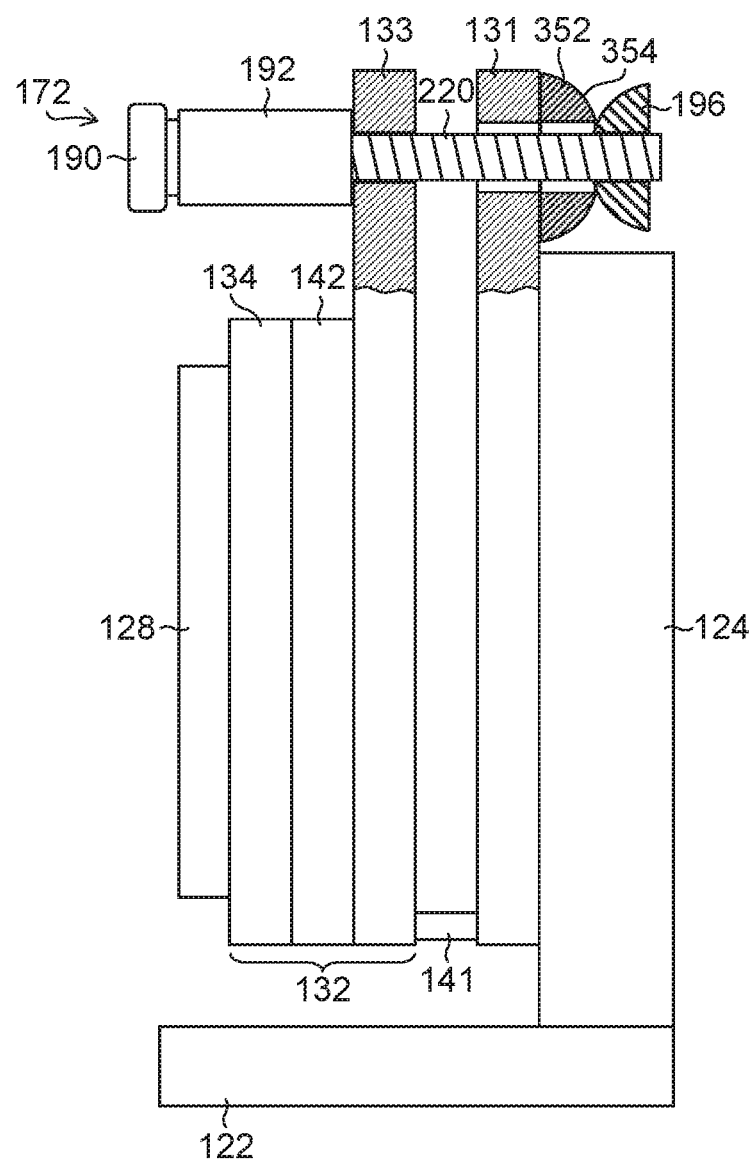
FIG. 31 is a schematic side view including a partial cross section schematically illustrating a configuration of an optical element angle adjustment device according to a tenth embodiment.

FIG. 31 is a schematic side view schematically illustrating a configuration of an optical element angle adjustment device according to a tenth embodiment. In FIG. 31, the same elements as those of the ninth embodiment illustrated in FIG. 30 are denoted by the same reference numerals. Description will be given on the difference from the ninth embodiment. Description on common parts is omitted.

In the tenth embodiment, a spherical nut 196 is used in place of the flat nut 350 of the ninth embodiment. A curved surface 196A of the spherical nut 196 abuts on the curved surface 354 that is a convex surface of the curved surface receiving part 352.

An abutting portion of the third plate 133 side, on which the spherical nut 266 provided at an end portion in the axis direction of the second hinge closing direction adjustment differential screw 182 abuts, is also provided with a curved surface receiving part having a convex surface serving as a receiving part for the spherical nut 266, although such a curved surface receiving part is not illustrated. The other configurations are the same as those of the ninth embodiment.

13.2 Operation

In the tenth embodiment, the convex surface of the spherical nut 266 abuts on the convex surface of the curved surface receiving part 352 provided on the hinge-type adjustment plate 126 side. Operation of angle adjustment in the tenth embodiment is similar to that of the first embodiment.

13.3 Effect

According to the tenth embodiment, in the hinge-type adjustment plate 126, deformation due to stress concentration on an abutting portion that is a point contact portion and/or a line contact portion with a differential screw for angle adjustment is suppressed.

14. Eleventh Embodiment 14.1 Configuration

Figure 32:
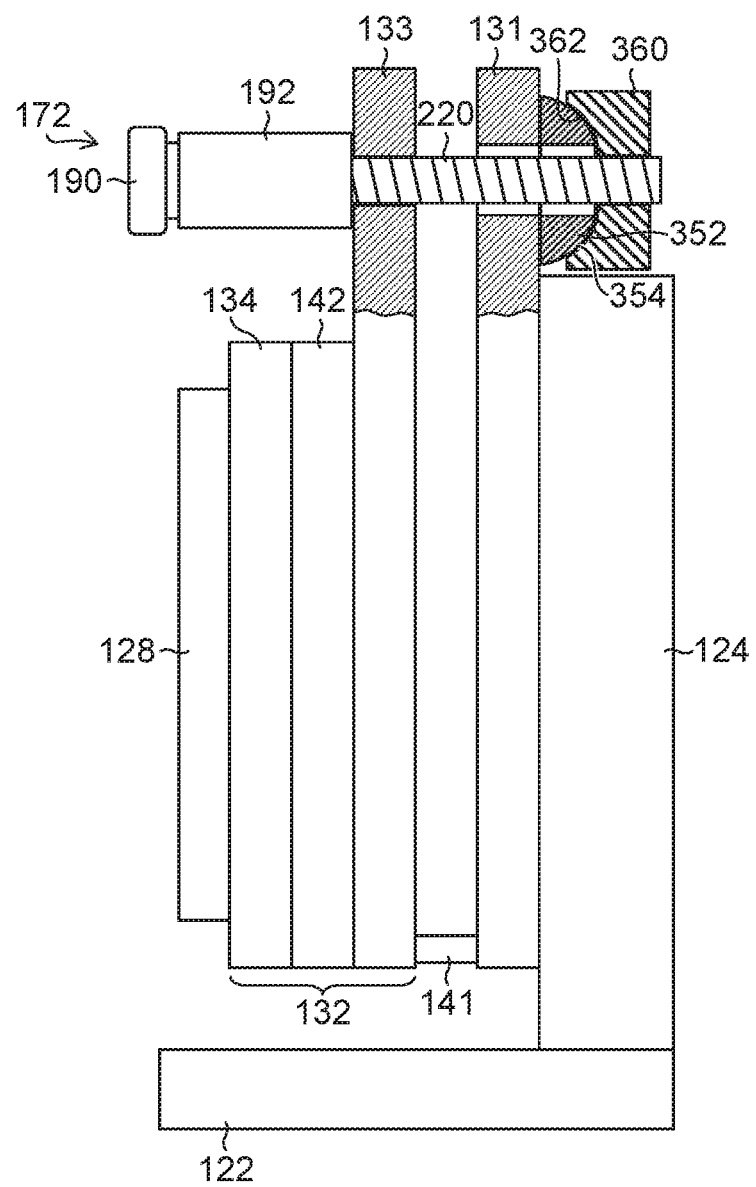
FIG. 32 is a schematic side view including a partial cross section schematically illustrating a configuration of an optical element angle adjustment device according to an eleventh embodiment.

FIG. 32 is a schematic side view schematically illustrating a configuration of an optical element angle adjustment device according to an eleventh embodiment. In FIG. 32, the same elements as those of the ninth embodiment illustrated in FIG. 30 are denoted by the same reference numerals. Description will be given on the difference from the ninth embodiment. Description on common parts is omitted.

In the eleventh embodiment, a concave spherical nut 360 is used in place of the flat nut 350. The concave spherical nut 360 includes a curved surface 362 that is a concave surface that slidably abuts on the curved surface 354 that is a convex surface of the curved surface receiving part 352. It is preferable that SUS440C, SKS3, or the like is used as a material of the concave spherical nut 360. Further, the radius of curvature of the curved surface 362 of the concave spherical nut 360 may be 15 millimeters [mm], for example. The other configurations are the same as those of the eighth embodiment.

An end portion in an axial direction of the second hinge closing direction adjustment differential screw 182 is provided with a concave spherical nut similar to the concave spherical nut 360, although such a concave spherical nut is not illustrated. An abutting portion of the third plate 133 side, on which the concave spherical nut abuts, is provided with a curved surface receiving part having a convex surface serving as a receiving part for the concave spherical nut, although such a curved surface receiving part is not illustrated. The other configurations are the same as those of the ninth embodiment.

14.2 Operation

In the eleventh embodiment, the curved surface 362 in a concave state of the concave spherical nut 360 abuts on the convex surface of the curved surface receiving part 352 provided on the hinge-type adjustment plate 126 side. Operation of angle adjustment in the eleventh embodiment is similar to that of the first embodiment.

14.3 Effect

According to the eleventh embodiment, in the hinge-type adjustment plate 126, deformation due to stress concentration on an abutting portion that is a point contact portion and/or a line contact portion with a differential screw for angle adjustment is suppressed.

15. Modifications of Embodiments

[Modification 1]

The first to eleventh embodiments describe exemplary configurations in which angle adjustment can be performed on each of a turning axis parallel to the x axis direction and a turning axis parallel to the y axis direction. However, it is also acceptable to have a structure enabling only one of angle adjustment of a turning axis parallel to the x axis direction and angle adjustment of a turning axis parallel to the y axis direction. In that case, in the hinge-type adjustment plate, it is only necessary to have a hinge structure that is either one of the first hinge structure and the second hinge structure.

[Modification 2]

The first to eleventh embodiments describe that a plate fixed to the optical element holder fixing plate 124 is the first plate 131. However, the definition of the first plate, second plate, third plate and fourth plate is not limited to that of the present example. For example, a plate on which the cooling holder 128 is provided may be referred to as a "first plate", and a plate to which the optical element holder fixing plate 124 is fixed may be referred to as a "fourth plate".

[Modification 3]

As a curved surface shape of a curved surface of a press member side provided on an end portion of an adjustment differential screw and/or a curved surface shape of a curved surface of a hinge-type adjustment plate side serving as a receiving part for the press member, part of a spherical surface or part of a cylindrical surface are illustrated as examples. A convex surface in a single protruding direction or a concave surface in a single recessed direction such as a spheroidal curved surface or a paraboloid surface may be adopted to the curved surfaces of the press member side and the hinge-type adjustment plate side.

[Modification 4]

As the optical element 150, various types of optical elements are adoptable, not limited to the dichroic mirror 37 of the beam combiner 26. The optical element 150 may be an element that transmits light or an element that does not transmit light. The structure of an optical element holding part is designed depending on the form of the optical element 150. For example, in place of the cooling holder 128, it is possible to adopt an optical element holder in which cooling mechanisms such as the cooling flow passage 158, the cooling water supply interface 160, and the cooling water recovery interface 161 are omitted.

[Modification 5]

The various types of configurations described in the first to eleventh embodiments can be used in combination, appropriately. The optical element angle adjustment device according to the present disclosure is not limited to one applied to an extreme ultraviolet light generation device. The optical element angle adjustment device according to the present disclosure may be applied to various devices or systems using an optical element such as a laser processor, a laser system, a photographing device, an illumination device, or the like.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be held". Moreover, an indefinite article "a/an" described in the present description and in the accompanying claims should be construed to mean "at least one" or "one or more".

What is claimed is:

1. An optical element angle adjustment device comprising:
    a first plate;
    a second plate facing the first plate;
    a first hinge being an elastic hinge configured to connect the first plate and the second plate with each other;
    an optical element holding part configured to hold an optical element, the optical element holding part being attached to at least one of the first plate and the second plate; and
    a first adjusting screw configured to apply force to the first plate and the second plate in a direction of closing the first hinge to adjust a tilt angle of at least one of the first plate and the second plate using the first hinge as a turning axis,
    the first adjusting screw having a first press member at an end in an axis direction of the first adjusting screw, the first press member being configured to slidably abut on one of the first plate and the second plate, and
    at least one of a first press member side abutting portion and a first hinge side abutting portion having a curved surface in a curved surface shape, the first press member side abutting portion being a portion of the first press member and being configured to abut on one of the first plate and the second plate, the first hinge side abutting portion being a portion of one of the first plate and the second plate on which the first press member abuts.

2. The optical element angle adjustment device according to claim 1, wherein
    the first adjusting screw includes a differential screw.

3. The optical element angle adjustment device according to claim 1, further comprising
    a second adjusting screw configured to apply force to the first plate and the second plate in a direction of opening the first hinge to adjust a tilt angle of at least one of the first plate and the second plate using the first hinge as a turning axis.

4. The optical element angle adjustment device according to claim 3, wherein
    both a first operation unit for turning the first adjusting screw and a second operation unit for turning the second adjusting screw are disposed on one of the first plate and the second plate.

5. The optical element angle adjustment device according to claim 3, wherein
    the first adjusting screw and the second adjusting screw are positioned on a plane perpendicular to the turning axis of the first hinge.

6. The optical element angle adjustment device according to claim 3, wherein
    the first adjusting screw is positioned farther from the first hinge than the second adjusting screw.

7. The optical element angle adjustment device according to claim 1, wherein
    the first press member is a spherical nut having a convex surface that is part of a spherical surface, and
    the curved surface of the first press member side abutting portion is the convex surface of the spherical nut.

8. The optical element angle adjustment device according to claim 7, further comprising
    a spherical washer having a concave surface that is part of a spherical surface abutting on the convex surface of the spherical nut, wherein
    the curved surface of the first hinge side abutting portion is the concave surface of the spherical washer.

9. The optical element angle adjustment device according to claim 1, wherein
    the first press member is a cylindrical nut having a convex surface that is part of a cylindrical surface, and
    the curved surface of the first press member side abutting portion is the convex surface of the cylindrical nut.

10. The optical element angle adjustment device according to claim 9, wherein
    an axis of the cylindrical surface of the cylindrical nut is parallel with the turning axis of the first hinge.

11. The optical element angle adjustment device according to claim 1, wherein
the optical element holding part is attached to the second plate out of the first plate and the second plate, and
the first press member abuts on the first plate.

12. The optical element angle adjustment device according to claim 11, wherein
the first plate has a curved surface shape as the curved surface of the first hinge side abutting portion.

13. The optical element angle adjustment device according to claim 12, wherein
the first press member includes a first press member side curved surface as the curved surface of the first press member side abutting portion,
the first plate includes a first hinge side curved surface as the curved surface of the first hinge side abutting portion, and
a radius of curvature of the first hinge side curved surface is larger than a radius of curvature of the first press member side curved surface.

14. The optical element angle adjustment device according to claim 11, wherein
the first hinge side abutting portion of the first plate is made of a first material,
the first plate includes a non-abutting portion that is a portion different from the first hinge side abutting portion and is made of a second material different from the first material, and
the first material is harder than the second material.

15. The optical element angle adjustment device according to claim 11, wherein
the first hinge side abutting portion and the first press member side abutting portion are made of a same material.

16. The optical element angle adjustment device according to claim 1, further comprising
a lock member configured to fix the tilt angle.

17. The optical element angle adjustment device according to claim 16, wherein
the tilt angle is fixed in such a manner that a lock plate that is the lock member is screwed to the first plate and the second plate.

18. The optical element angle adjustment device according to claim 1, wherein
the second plate includes:
a third plate;
a fourth plate facing the third plate; and
a second hinge being an elastic hinge configured to connect the third plate and the fourth plate with each other,
the third plate is connected with the first plate via the first hinge,
the optical element holding part is attached to the fourth plate,
a turning axis of the second hinge and the turning axis of the first hinge are orthogonal to each other,
the optical element angle adjustment device further includes
a third adjusting screw configured to apply force to the third plate and the fourth plate in a direction of closing the second hinge to adjust a tilt angle of at least one of the third plate and the fourth plate using the second hinge as a turning axis,
the third adjusting screw having a second press member at an end in an axis direction of the third adjusting screw, the second press member being configured to slidably abut on one of the third plate and the fourth plate, and
at least one of a second press member side abutting portion and a second hinge side abutting portion having a curved surface in a curved surface shape, the second press member side abutting portion being a portion of the second press member and being configured to abut on one of the third plate and the fourth plate, the second hinge side abutting portion being a portion of one of the third plate and the fourth plate on which the second press member abuts.

19. The optical element angle adjustment device according to claim 18, further comprising
a fourth adjusting screw configured to apply force to the third plate and the fourth plate in a direction of opening the second hinge to adjust a tilt angle of at least one of the third plate and the fourth plate using the second hinge as a turning axis.

20. An ultraviolet light generation device comprising:
a chamber in which plasma is generated in the chamber;
a droplet generator configured to feed, into the chamber, a droplet of a target substance that is a generation source of the plasma;
an optical element disposed on an optical path of laser light radiated to the droplet; and
an optical element angle adjustment device to which the optical element is mounted,
a target of the droplet fed from the droplet generator into the chamber being irradiated with the laser light and being made into plasma, and ultraviolet light being generated,
the optical element angle adjustment device including:
a first plate;
a second plate facing the first plate;
a first hinge being an elastic hinge configured to connect the first plate and the second plate with each other;
an optical element holding part configured to hold an optical element, the optical element holding part being attached to at least one of the first plate and the second plate; and
a first adjusting screw configured to apply force to the first plate and the second plate in a direction of closing the first hinge to adjust a tilt angle of at least one of the first plate and the second plate using the first hinge as a turning axis,
the first adjusting screw having a first press member at an end in an axis direction of the first adjusting screw, the first press member being configured to slidably abut on one of the first plate and the second plate, and
at least one of a first press member side abutting portion and a first hinge side abutting portion having a curved surface in a curved surface shape, the first press member side abutting portion being a portion of the first press member and being configured to abut on one of the first plate and the second plate, the first hinge side abutting portion being a portion of one of the first plate and the second plate on which the first press member abuts.

* * * * *